United States Patent [19]
Hashimoto et al.

[11] Patent Number: 5,523,642
[45] Date of Patent: Jun. 4, 1996

[54] EXTERNAL FORCE MEASURING SYSTEM AND COMPONENT MOUNTING APPARATUS EQUIPPED WITH SAME

[75] Inventors: Masahiko Hashimoto, Toyonaka; Yoshio Tomigashi, Neyagawa; Yoshitoshi Morita, Kawanishi; Michio Kunimitsu, Hirakata; Akira Sakaguchi, Kobe; Tomomi Yamaguchi, Kyoto, all of Japan

[73] Assignees: Sanyo Electric Co., Ltd., Osaka; Advanced Software Technology & Mechatronics Research Institute of Kyoto, Kyoto, both of Japan

[21] Appl. No.: 426,478

[22] Filed: Apr. 20, 1995

Related U.S. Application Data

[63] Continuation of Ser. No. 127,277, Sep. 27, 1993, abandoned.

[30] Foreign Application Priority Data

| Sep. 28, 1992 | [JP] | Japan | 4-257698 |
| Oct. 26, 1992 | [JP] | Japan | 4-287168 |
| Oct. 26, 1992 | [JP] | Japan | 4-287302 |
| Feb. 17, 1993 | [JP] | Japan | 5-027736 |

[51] Int. Cl.⁶ ............................................. H01L 41/113
[52] U.S. Cl. .......................... 310/319; 310/326; 310/338
[58] Field of Search ........................... 310/319, 326, 310/338, 339

[56] References Cited

U.S. PATENT DOCUMENTS

| 3,320,580 | 5/1967 | Sykes | 340/10 |
| 3,720,409 | 3/1973 | Kubo et al. | 271/29 |
| 4,009,447 | 2/1977 | Wolf et al. | 310/319 |
| 4,539,554 | 9/1985 | Jarvis et al. | 345/365 A |
| 4,565,940 | 1/1986 | Hubbard | 310/326 |
| 4,605,833 | 8/1986 | Lindberg | 219/56.22 |
| 4,631,685 | 12/1986 | Peter | 364/476 |
| 4,690,116 | 9/1987 | Takahashi | 123/425 |
| 4,760,345 | 7/1988 | Büsser et al. | 330/9 |
| 4,807,356 | 2/1989 | Maruyama et al. | 29/740 |
| 4,815,913 | 3/1989 | Hata et al. | 414/225 |
| 5,016,907 | 5/1991 | Akatsu et al. | 280/707 |
| 5,053,671 | 10/1991 | Kobayashi et al. | 310/329 |
| 5,065,933 | 11/1991 | Basavanhally | 228/102 |
| 5,113,581 | 5/1992 | Hidese | 29/840 |
| 5,285,946 | 2/1994 | Tomigashi et al. | 228/9 |

FOREIGN PATENT DOCUMENTS

| 60-66500 | 4/1985 | Japan. | |
| 60-214232 | 10/1985 | Japan | G01L 1/18 |
| 63-22292 | 1/1988 | Japan | B25J 19/02 |
| 63-232496 | 9/1988 | Japan. | |
| 0246899 | 10/1989 | Japan | H05K 13/04 |
| 1-246899 | 10/1989 | Japan | H05K 13/14 |
| 3-287338 | 12/1991 | Japan | B23Q 3/08 |

*Primary Examiner*—Thomas M. Dougherty
*Attorney, Agent, or Firm*—Nikaido, Marmelstein, Murray & Oram

[57] ABSTRACT

In an external force measuring system comprising a piezoelectric element 61 for producing a charge when acted on by an external force, and a charge amplifier 7 chargeable with a variation in the charge produced by the piezoelectric element to output a voltage signal, the charge amplifier 7 comprises a feedback loop having an on-off controllable switch 8 connected in parallel therewith. The switch 8 is on-off controlled by a comparator 81 for comparing the output voltage with a reference value and is closed while no external force acts on the element.

3 Claims, 18 Drawing Sheets

FIG.27
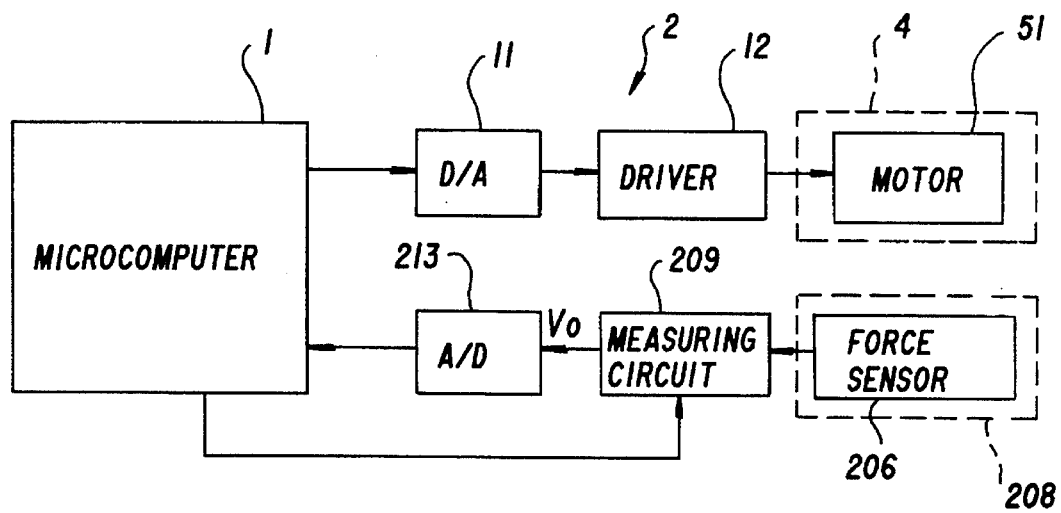
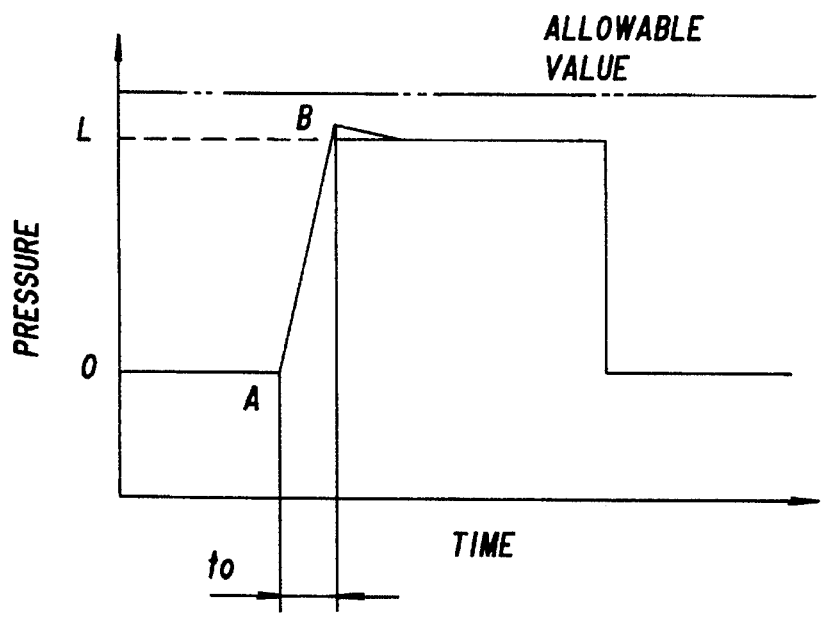
FIG.28

EXTERNAL FORCE MEASURING SYSTEM AND COMPONENT MOUNTING APPARATUS EQUIPPED WITH SAME

This application is a continuation of application Ser. No. 08/127,277 filed Sep. 27, 1993 now abandoned.

FIELD OF THE INVENTION

The present invention relates to systems for measuring external forces acting on parts or components, for example, for use in a chip mounter for mounting electronic components on the surface of a board, and to component mounting apparatus equipped with the system.

BACKGROUND OF THE INVENTION

Conventional apparatus for automatically mounting electronic components on the surface of a printed wiring board each in position comprise a suction head mechanism having a suction nozzle for attracting the electronic component by suction. The suction head mechanism is mounted on a reciprocating device which is movable as controlled in the directions of X-axis, Y-axis and Z-axis.

When the above apparatus is used for surface mounting, the suction head mechanism is first moved to a component feed portion of an electronic component feeder, the suction nozzle is caused to attract an electronic component thereto by a vacuum, and the component is thereafter moved to a position above a printed board, whereupon the suction head mechanism is lowered to place the component in position on the surface of the board.

Upon the component coming into contact with the printed board, the suction head mechanism is further driven downward, whereby the component is pressed against a bonding layer or solder paste layer on the board surface and fixed or temporarily fixed to the board.

The suction head mechanism is thereafter returned to above the component feeder, followed by the subsequent cycle of surface mounting operation.

With the conventional surface mounting apparatus, the upward and downward movement of the suction head mechanism is effected by operating a cam mechanism. The cam mechanism has a cam curve which is so designed that an excessive impact force or pressure will not act on electronic components when the suction nozzle is pressed against the component on the feeder and also when the attracted component is pressed against the printed board.

In recent years, however, a wide variety of electronic components are introduced into use which differ variously in configuration, size (thickness) and material. These components include, for example, delicate parts such as IC (LSI) bear chips. The electronic components to be mounted by the surface mounting apparatus therefore differ greatly in mechanical properties with the type of components.

Accordingly, in mounting different types of electronic components by the surface mounting apparatus, the pressure to be exerted on the component when the component is held by suction and when it is mounted on the surface must be controlled to a suitable value for each of the different types.

The suction head mechanisms already proposed for use in surface mounting apparatus include, those which are driven by a linear motor (Unexamined Japanese Patent Publications SHO 60-66500 and SHO 63-232496), those which are driven by a compression spring (Unexamined Japanese Patent Publication SHO 63-22292), those wherein electropneumatic regulator is utilized (Unexamined Japanese Patent Publication HEI 1-246899), etc.

However, the apparatus wherein the linear motor is used for driving has the problem that the apparatus is complex in construction and has a great weight. With the apparatus wherein the compression spring or electropneumatic regulator is used, it is difficult to accurately control the pressure to be actually exerted on the electronic component.

To overcome this problem, a system appears useful which comprises a piezoelectric element mounted on the component suction head for measuring the pressure to control the upward and downward movement of the head in accordance with the output voltage of the piezoelectric element and to press the electronic component against the printed board with a predetermined pressure.

Electrically, the piezoelectric element can be regarded as a capacitor. When subjected to a force, the piezoelectric element produces a charge in proportion to the acting force as expressed by Equation (1).

$$Q = d_{33} \cdot F \tag{1}$$

wherein Q is the amount of charge (C), F is the acting force (N), and $d_{33}$ is an equivalent piezoelectric constant ($\times 10^{-12}$C/N).

Accordingly, the pressure can be measured by detecting the charge produced from the piezoelectric element.

On the other hand, a charge amplifier as shown in FIG. 2 is generally used for detecting the charge produced by the piezoelectric element. The illustrated charge amplifier 7 comprises an OP amplifier 71 of the FET input type connected to an output terminal of a pierzoelectric element 61, and a resistor Rf and a capacitor Cf included in a feedback loop of the amplifier. The charge produced by the element 61 is converted to a voltage signal and output by the amplifier 7.

The resistor Rf connected in parallel with the capacitor Cf of the feedback loop serves to stabilize the dc component.

The output voltage of the charge amplifier 7 attenuates in accordance with a time constant which is dependent on Cf·Rf (curve a-c shown in FIG. 3). The attenuation can be diminished by increasing the values of Cf and Rf.

However, the value of Cf can not be increased without a limit to assure the charge amplifier 7 of a gain since the gain is the reciprocal of the Cf value. The value of Rf for giving a stabilized dc component can not be increased limitlessly, either.

Further at the time point of completion of a pressing action for mounting an electronic component, the capacitor Cf is charged in the negative direction by an amount corresponding to the charge which leaked toward the resistor side upon pressing, so that the output voltage at that time point lowers from point c to point e as shown in a broken line in FIG. 3 and thereafter gradually increases toward the positive direction.

Accordingly, if another pressing action is performed at a time point at which the output voltage has yet to return to zero level, the relationship between the output voltage and the pressure deviates by an amount corresponding to the negative output voltage at the time point to make accurate measurement impossible. This problem becomes pronounced owing to a cumulative effect in the case where Cf and Rf are each set at a great value.

Not only when the charge amplifier is used but also when an OP amplifier of the FET input type is used as the detection circuit to which the piezoelectric element is to be connected, the capacitance of the piezoelectric element and the resistance of the detection circuit provides a time constant, so that a similarly problem is encounted also in the latter case.

SUMMARY OF THE INVENTION

An object of the present invention is to provide an external force measuring system which comprises a piezoelectric element for producing a charge when acted on by an external force, and a charge amplifier chargeable with a variation in the charge produced by the piezoelectric element to output a voltage signal, and in which the attenuation of the output voltage of the charge amplifier can be suppressed to the greatest possible extent, the system being adapted to give accurate measurements even when a measuring operation is repeated.

Another object of the invention is to provide an external force measuring system which comprises a piezoelectric element for producing a charge when acted on by an external force, and a detection circuit such as a charge amplifier chargeable with a variation in the charge produced by the piezoelectric element to output a voltage signal, and in which the attenuation of the output voltage of the detection circuit is compensated for to thereby enable the system to give accurate measurements even when a measuring operation is repeated.

The present invention provides an external force measuring system wherein an on-off controllable switch is connected in parallel with a feedback loop of a charge amplifier connected to the output end of a piezoelectric element. The switch is on-off controlled by control means and is closed while no external force acts on the element.

The control means comprises means for detecting a time point when the output voltage of the charge amplifier has dropped below a predetermined reference value to close the switch at the time point. The control means can be of a construction having means for detecting a time point at which the external force approaches close to the piezoelectric element to close the switch at the time point.

The present invention further provides a component mounting apparatus which is equipped with an external force measuring system for measuring a pressure acting on a component, the system comprising a piezoelectric element mounted on a component suction head for producing a charge in accordance with the pressure, and a charge amplifier chargeable with a variation in the charge produced by the piezoelectric element to output a voltage signal.

The charge amplifier comprises a feedback loop which has an on-off controllable switch connected in parallel therewith. The switch is on-off controlled by control means and is closed during the period after the completion of a mounting action and before the initiation of the subsequent mounting action.

With the external force measuring system described, the feedback loop of the charge amplifier has a time constant which is made as great as possible to suppress the attenuation of the output voltage of the charge amplifier to the greatest possible extent. This also reduces a variation in the output voltage in the negative direction at a time point when the external force has lowered to the zero level.

Owing to the increase in the time constant, the output voltage returns to the positive direction with low responsiveness after the variation in the negative direction, whereas the switch is held closed by the control means while no external force acts on the piezoelectric element, thereby permitting the output voltage to reach the zero level rapidly. Consequently, even when the subsequent external force measurement is performed a short period thereafter, an accurate measurement is available with no deviation involved in the relationship between the output voltage and the pressure.

Further with the component mounting apparatus, the external force measuring system operates similarly to afford accurate measurements even when the pressing action is repeated frequently.

With the external force measuring system of the present invention, the attenuation of the output voltage of the charge amplifier can be suppressed to the greatest possible extent, and the system gives accurate measurements even in the case where the external force measuring operation is repeated. Especially, the component mounting apparatus equipped with the external force measuring system of the invention is adapted to accurately measure the pressure acting on components when they are mounted. This realizes a reliable mounting operation without causing damage to the components.

The present invention further provides another external force measuring system which comprises a piezoelectric element for producing a charge when acted on by an external force, and a detection circuit for producing a voltage signal Vo in accordance with the charge produced by the piezoelectric element, the detection circuit having compensation means connected to the output end thereof for subjecting the voltage signal Vo to integration processing and adding the integrated signal to the voltage signal Vo to output the resulting signal.

The present invention provides another component mounting apparatus which is equipped with an external force measuring system for measuring a pressure acting on a component, the system comprising a piezoelectric element mounted on a component suction head for producing a charge in accordance with the pressure, and a detection circuit for outputting a voltage signal Vo in accordance with the charge produced by the piezoelectric element. The detection circuit has compensation means connected to the end thereof for subjecting the voltage signal Vo to integration processing and adding the integrated signal to the voltage signal Vo to output the resulting signal.

Although the voltage signal Vo output from the detection circuit attenuates in accordance with the time constant of the circuit, the integration of the voltage signal Vo prepares a signal corresponding to the amount of integration, and the addition of this signal to the original voltage signal Vo compensates for the attenuation of the voltage signal. This makes it possible to obtain an accurate measurement corresponding to the magnitude of the external force regardless of the value of the time constant of the feedback loop.

Further with the component mounting apparatus, the external force measuring system operates similarly to give accurate measurements even when the pressing action is repeated frequently as when the action is performed only once, without disturbing the relationship between the output voltage and the pressure.

Since the attenuation of the output voltage of the detection circuit is compensated for, the external force measuring system of the invention described affords accurate measurements even in the case where the external force measuring operation is repeated. Especially, the component mounting apparatus equipped with the external force measuring system of the invention is adapted to accurately measure the pressure acting on components when they are mounted. This realizes a reliable mounting operation without causing damage to the components.

BRIEF DESCRIPTION OF THE DRAWINGS

FIG. 27 is a block diagram of a motor drive system of the automatic electronic component mounting apparatus; and FIG. 28 is a graph showing variations in pressure when a component is mounted.

DETAILED DESCRIPTION OF EMBODIMENTS

Several embodiments of the present invention will be described below in detail with reference to the drawings.

First Embodiment

FIGS. 4 to 9 specifically show the construction of an automatic electronic component mounting apparatus embodying the invention. First, the mechanism of the apparatus will be described.

Figure 4:
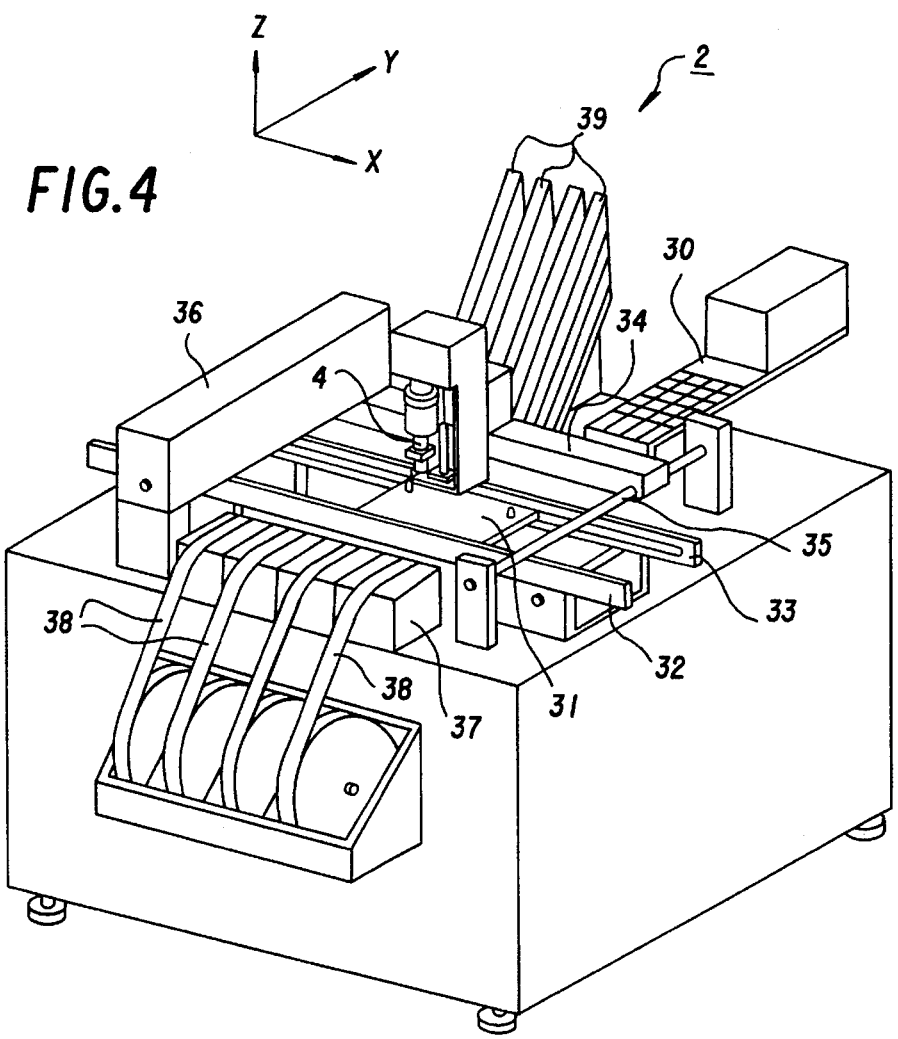
FIG. 4 is a perspective view showing an appearance of a surface mounting apparatus.

As shown in FIG. 4, the mounting apparatus 2 has mounted on a frame a pair of guide rails 32, 33 for transporting printed wiring boards 31, and a tray 30 for placing electronic components thereon. Arranged on opposite sides of the guide rails 32, 33 are a tape feeder unit 37 for feeding electronic components taped as at 38 intermittently by one pitch at a time, and magazines 39 for containing electronic components as stacked up vertically.

A suction head mechanism 4 for holding the electronic component thereto by suction is moved in an X-axis direction and Y-axis direction by an X-Y table, which has a pair of Y-axis guides 35, 36 mounted on the frame and extending in the Y-axis direction, and an X-axis guide 34 slidably in engagement with the guides and drivable in the Y-axis direction. The suction head mechanism 4 is mounted on the X-axis guide 34 and reciprocatingly movable in the X-axis direction.

Figure 5:
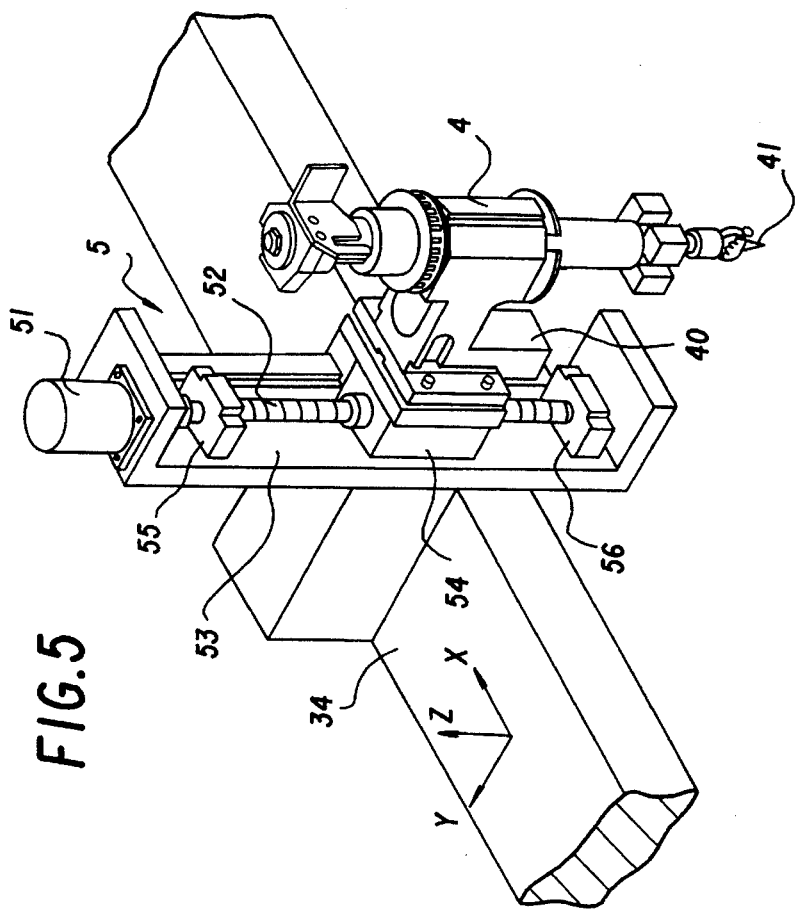
FIG. 5 is a perspective view showing the appearance of a suction head mechanism mounted on a head lift mechanism.

As seen in FIG. 5, a head lift mechanism 5 comprises a Z-axis guide 53 slidably in engagement with the X-axis guide 34 and having a ball screw 52 vertically supported by a pair of bearings 55, 56 on the Z-axis guide 53.

In screw-thread engagement with the ball screw 52 is a lift block 54 slidably in engagement with the Z-axis guide 53 and movable upward and downward by being guided by the screw 52. A motor 51 mounted on the Z-axis guide 53 is connected to the upper end of the ball screw 52. The lift block 54 has fixed thereto a support arm 40 projecting from the suction head mechanism 4.

Accordingly, the ball screw 52, when rotated by the operation of the motor 51, drives the lift block 54 upward or downward by screw thrust to move the mechanism 4 upward or downward therewith.

Figure 6:
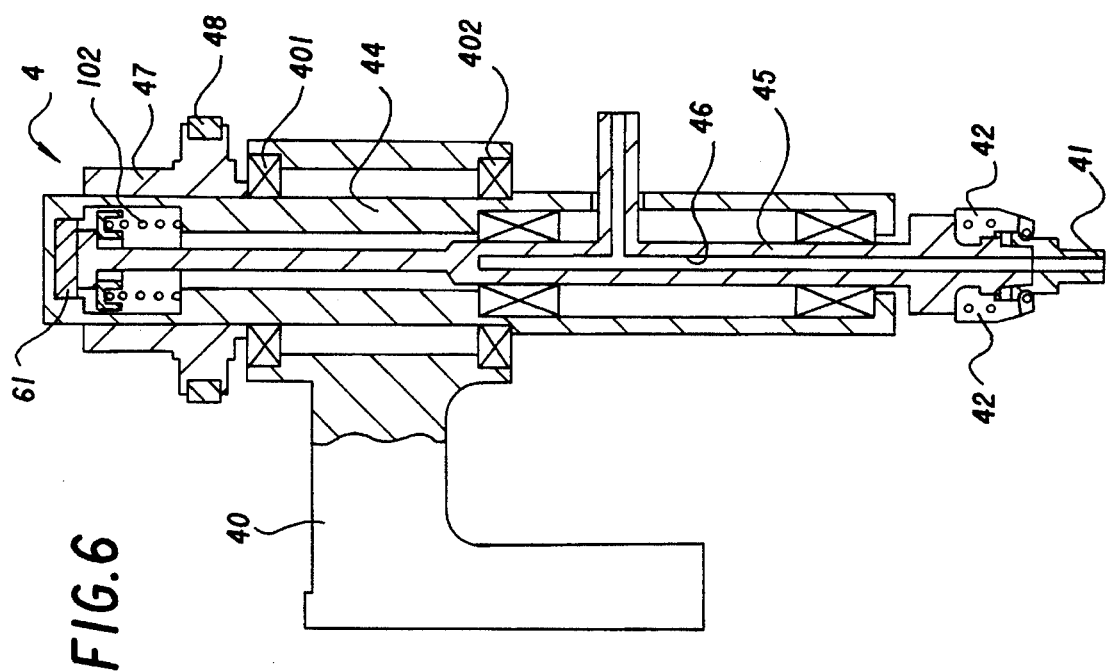
FIG. 6 is a sectional view of the suction head mechanism.

With reference to FIG. 6, the suction head mechanism 4 comprises an outer tube 44 vertically supported by bearings 401, 402 on the support arm 40, and an inner tube 45 disposed inside the outer tube 44 in engagement therewith so as to be movable axially of the outer tube 44 but nonrotatable relative thereto.

The inner tube 45 has a center bore 46 communicating with an unillustrated vacuum pump. A pair of clamp arms 42, 42 is attached to the lower end of the inner tube 45 for holding a suction nozzle 41 by clamping.

Provided inside the top of the outer tube 44 is a piezoelectric element 61 serving as a pressure sensor. The piezoelectric element 61 comprises a piezoelectric material such as quartz or lead titanate zirconate, and when strained under a load, produces a charge corresponding to the amount of strain. Accordingly, the pressure acting on a component when the component comes into contact with a printed wiring board can be measured by detecting the amount of charge produced.

The inner tube 45 is coupled to the outer tube 44 by a spring 102. The top face of the inner tube 45 is in contact with the lower surface of the piezoelectric element 61 with the spring 102 slightly contracted by the weight of the inner tube 45. A force exerted by the printed board on a component as held by the suction nozzle 41 subjects the piezoelectric element 61 to a pressure, whereupon the element produces a charge corresponding to the pressure.

Figure 7:
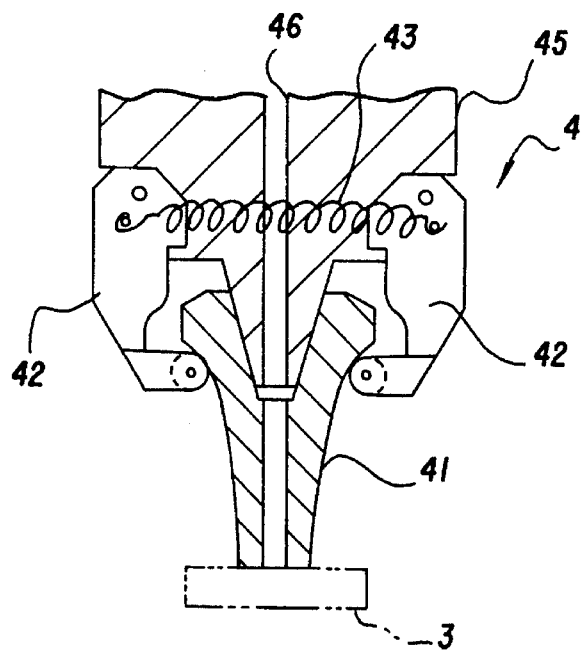
FIG. 7 is an enlarged sectional view a nozzle portion of the suction head mechanism.

As shown in FIG. 7, the pair of clamp arms 42, 42 is pivoted to the lower end of the inner tube 45, and a spring 43 is connected between the two arms. Thus, the suction nozzle 41 is removably held clamped by the arms 42, 42 with its nozzle orifice in communication with the center bore 46 of the inner tube 45.

The outer tube 44 is provided with a pulley 47 which is driven by a timing belt 48. The outer tube 44 is rotated through a predetermined angle by an unillustrated mechanism to orient an electronic component 3 held by the suction nozzle 41 toward a desired direction.

Figure 8:
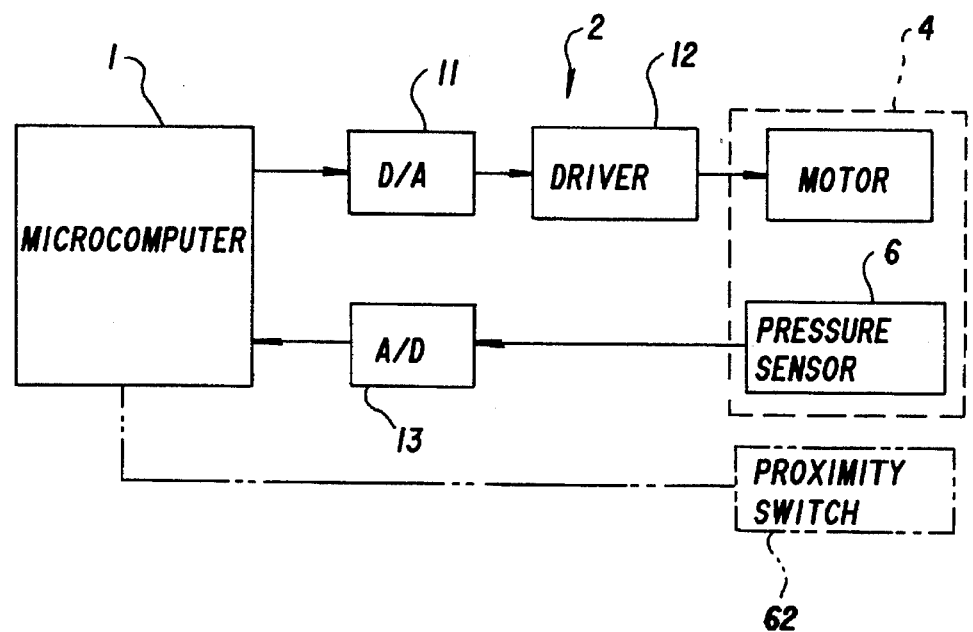
FIG. 8 is a block diagram showing amotor drive system of the surface mounting apparatus.

The automatic electronic component mounting apparatus 2 described has its operation controlled by a microcomputer 1 shown in FIG. 8. To control the lift drive motor 51 of the apparatus, the pressure sensor 6 provided by the piezoelectric element feeds an output signal to the microcomputer 1 via an A/D converter 13. Based on the signal, the microcomputer 1 prepares a motor control signal, which is sent via a D/A converter 11 to a motor driver 12 to thereby control the rotation of the motor 51.

Figure 9:
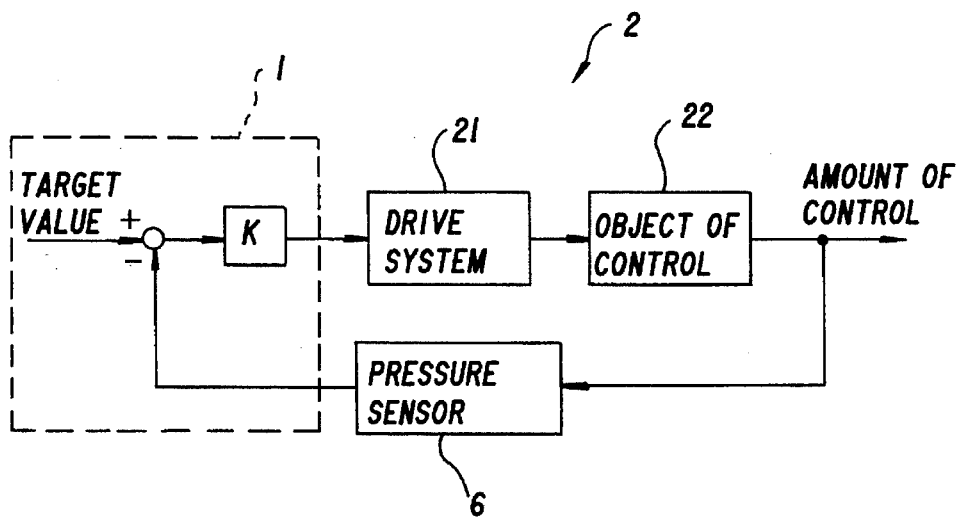
FIG. 9 is a a control block diagram showing a pressure control system.

The motor 51 is controlled based on the detection signal of the pressure sensor 6 in the manner to be described below. FIG. 9 is a block diagram showing a system for controlling the pressure. For the control of pressure, the microcomputer 1 has stored therein a predetermined pressure value which serves as a target value, and the motor 51 is controlled by feedback so as to control the force to be exerted on the electronic component to the specified value.

The deviation of the pressure detected by the pressure sensor 6 from the target value set in the microcomputer 1 is fed to a drive system 21 including the motor 51. The pressure obtained from an object 22 of control including the electronic component and printed board is detected by the pressure sensor 6 and fed back to the microcomputer 1.

The control thus effected permits the component 3 to be mounted on the printed board 31 with the predetermined pressure. The time point of completion of the pressure control can be realized, for example, by causing the target value to be output by the computer 1 to fall to zero, or by rotating the lift motor 51 in a direction to raise the suction nozzle 41 from the printed board 31 upon lapse of a predetermined period of time as measured from the start of the pressing action.

The above mode of control is used not only when the component 3 is mounted on the board 31 but also when the component is attracted from the component feed portion.

When the component has been completely mounted on the surface of the board, the next electronic component is attracted and mounted by repeating the same procedure as above.

Figure 1:
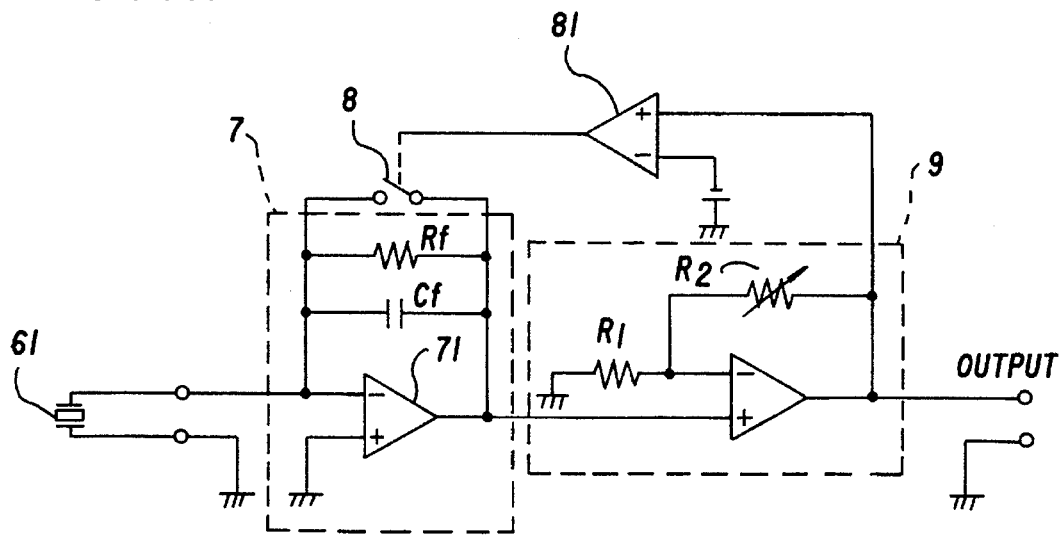
FIG. 1 is a circuit diagram showing the construction of an external force measuring system in a first embodiment.
Figure 2:
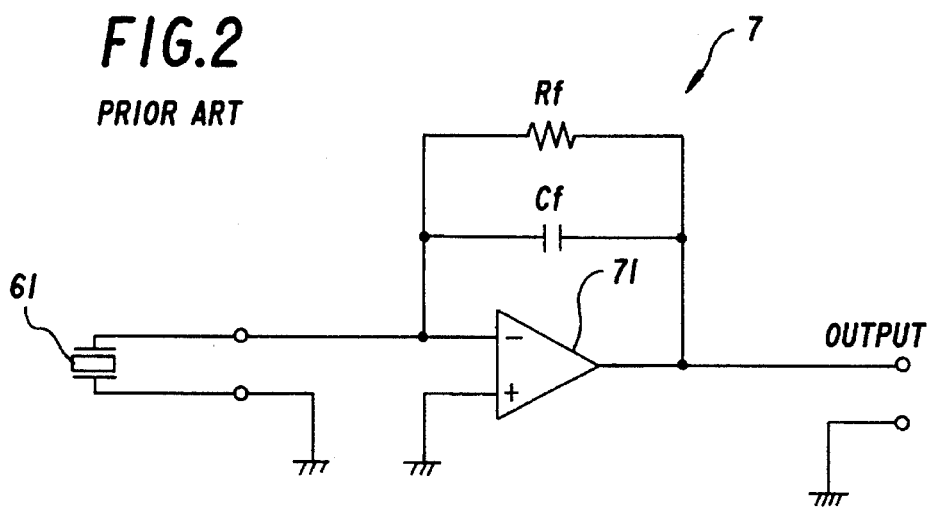
FIG. 2 is a circuit diagram of a conventional external force measuring system.

The charge produced by the piezoelectric element 61 is fed to the external force measuring system shown in FIG. 1 and converted to a voltage signal to measure the pressure involved in mounting the component.

As illustrated in FIG. 1, a charge amplifier 7 is connected to the output end of the piezoelectric element 61. The amplifier 7 has a known OP amplifier 71 of the FET input type and a feedback loop, which has inserted therein a capacitor Cf chargeable with the charge produced by the element 61, and a resistor Rf connected in parallel with the capacitor for stabilizing the dc component of the output voltage.

Connected to the charge amplifier 7 subsequent thereto is a non-inverting amplifier 9 for compensating for errors due to variations in Cf and amplifying the output voltage to a suitable value. If the non-inverting amplifier 9 is set to a suitably great amplification factor, the reduction in the gain can be compensated for even if the values of Cf and Rf are made as great as possible so as to suppress the attenuation of the output signal to the greatest possible extent.

Further with the external force measuring system of the present invention, an FET switch 8 is connected in parallel with the capacitor Cf and resistor Rf of the feedback loop for the offset adjustment of a reference value of the output voltage. The output voltage of the non-inverting amplifier 9 is fed to a comparator 81 and compared with the reference voltage to on-off control the FET switch 8 in accordance with the result of comparison.

Figure 3:
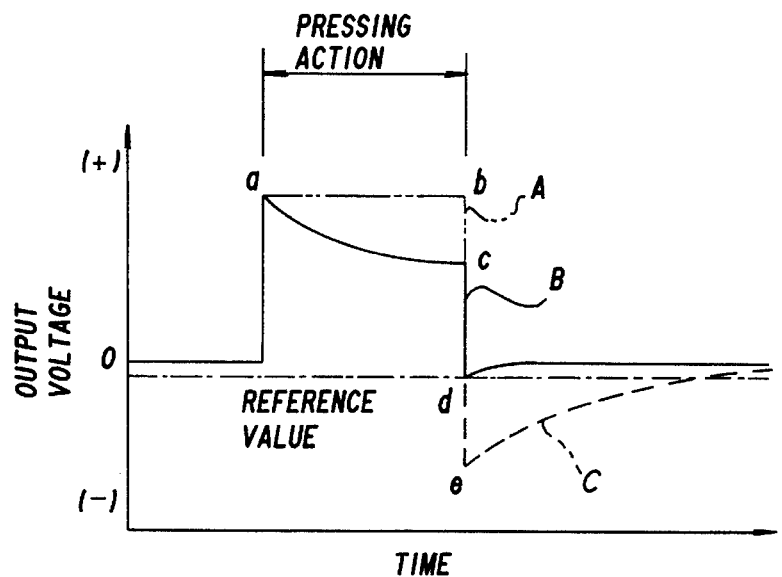
FIG. 3 is a graph showing variations in the output voltage of the external force measuring system.

The mode of on-off control will be described with reference to FIG. 3. In FIG. 3, a pulse waveform A indicated in a two-dot-and-dash line and including point a and point b represents a variation in the pressure acting on the piezoelectric element.

The reference value of the comparator with which the output voltage is to be compared is set at a negative value slightly lower than the zero level as indicated in a dot-and-dash line in FIG. 3. At the time point when a solid line representing the variation in the output voltage and extending through point a and point c passes through point d of the reference value, the comparator 81 functions to close the FET switch 8.

Consequently, the waveform B of the output voltage rapidly returns from point d toward the zero level without lowering to point e, whereby offset adjustment is automatically made. Even when the pressing action is frequently repeated, therefore, the output voltage has returned to zero before the pressing action is initiated. This obviates accumulation of errors, consequently making it possible to accurately measure the pressure exerted when the component is mounted and realize a reliable mounting operation without causing damage to the component.

With the embodiment described, the time point of completion of the pressing action is detected from a drop in the output voltage to close the switch at that time point, whereas the switch may be closed immediately before the subsequent pressing action is started.

For example, a proximity switch can be provided as associated with the suction head mechanism 4 for detecting the time point when the component held by the suction head mechanism 4 is brought close to the board. In this case, the proximity switch 62 feeds an operation signal to the microcomputer 1 as shown in FIG. 8 to on-off operate the FET switch under the control of the computer.

A limit switch or the like is usable in place of the proximity switch.

The microcomputer 1 controls the descent of the suction head mechanism 4, is able to recognize the time point when the component has lowered to the vicinity of the board based on the control operation thereof and can therefore be adapted to on-off control the FET switch singly.

Second Embodiment

Although this embodiment is similar to the first embodiment with respect to the construction of automatic component mounting apparatus, the embodiment is characterized in that it has means for compensating for the attenuation of the output signal of the pressure sensor 6.

The piezoelectric element 61 serving as the pressure sensor produces a charge q when subjected to a load as expressec by Equation (1). Suppose the charge q includes a charge $q_C$ stored in the capacitor of the charge amplifier 7, and a charge $q_R$ flowing to the resistor, and the voltage across the capacitor and resistor is Vo. The relationship between the charges q, $q_C$ and $q_R$ is then expressed by Equation (2).

$$q = q_C + q_R \quad (2)$$

On the other hand, the voltage Vo has the relationship of Equation (3) with the charges $q_C$ and $q_R$.

$$Vo = q_C/Cf = Rf \cdot dq_R/dt \quad (3)$$

Accordingly rewriting Equation (2) using Equation (3) gives Equation (4).

$$q = Cf \cdot Rf \cdot dq_R/dt + q_R \quad (4)$$

Therefore, when the charge q is taken as an input and the voltage Vo as an output, the transfer function is expressed by Equation (5).

$$Vo/q = (1/Cf)\{1 - 1/(Cf \cdot Rf \cdot s + 1)\} \quad (5)$$

Suppose the compensated voltage signal obtained by compensating for the amount of attenuation of the output voltage Vo is V, and assume that the transfer function of the compensation element is expressed by Equation (6).

$$V/Vo = K(K_p + K_i/s) \quad (6)$$

Since the compensated voltage signal V is a value in the case where the output voltage is not attenuated by the resistor, the signal needs to satify Equation (7) below.

$$V = q/Cf \quad (7)$$

The coefficients of Equation (6) satisfying Equation (7) are given by Equation (8), Equation (9) and Equation (10).

$$K_i = 1/Rf \quad (8)$$

$$K_p = Cf \quad (9)$$

$$K = 1/Cf \quad (10)$$

The transfer function of the compensation element is defined by Equation (11) given below.

$$V/Vo = 1 + 1/(Cf \cdot Rf \cdot s) \quad (11)$$

Thus, there is the relationship of Equation (12) between V and Vo.

$$V = Vo + (1/Cf \cdot Rf) \int Vo dt \quad (12)$$

The compensated voltage signal V can be determined by arithmetically processing the right member of Equation (11) for the voltage signal Vo output from the charge amplifier 7.

Figure 10:
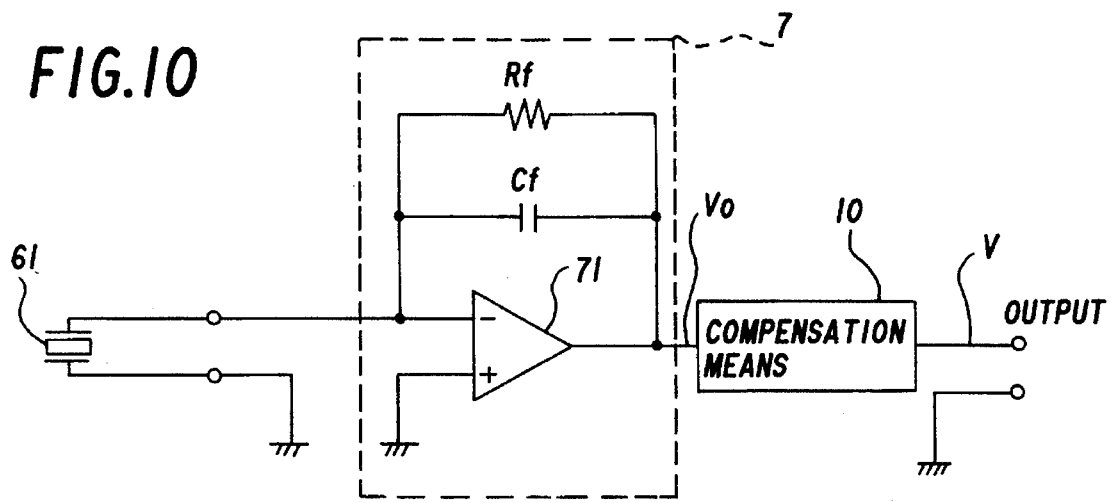
FIG. 10 is a circuit diagram showing the construction of an external force measuring system in a second embodiment.

FIG. 10 shows the construction of an external force measuring system embodying the invention and having compensation means (10) connected to the output terminals of the charge amplifier 7 for the above arithmetic processing.

Figure 11A:
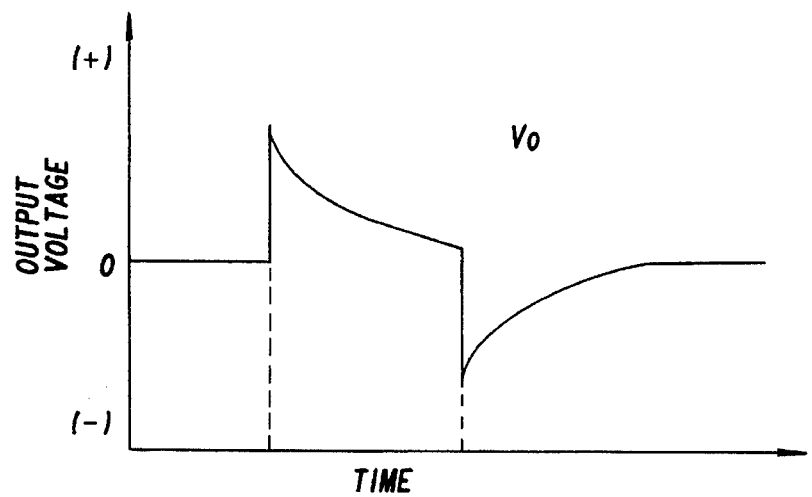
FIG. 11 includes waveform diagrams showing a process for preparing a compensation voltage signal in the system.
Figure 11B:
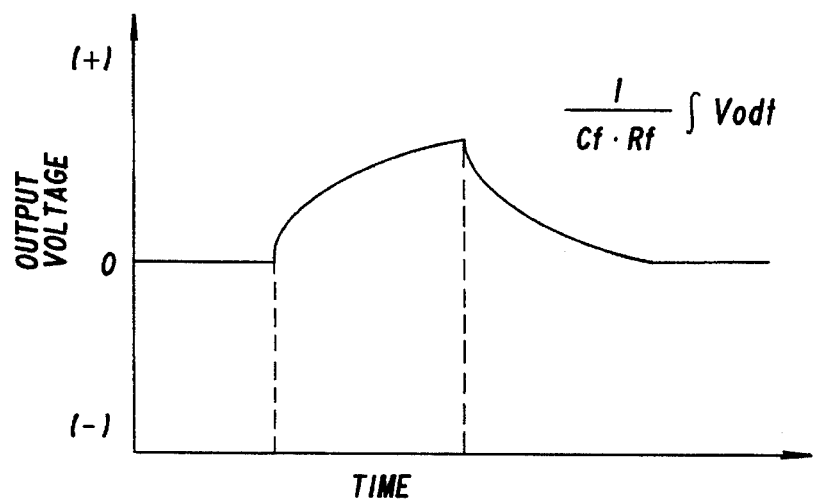
Figure 11C:
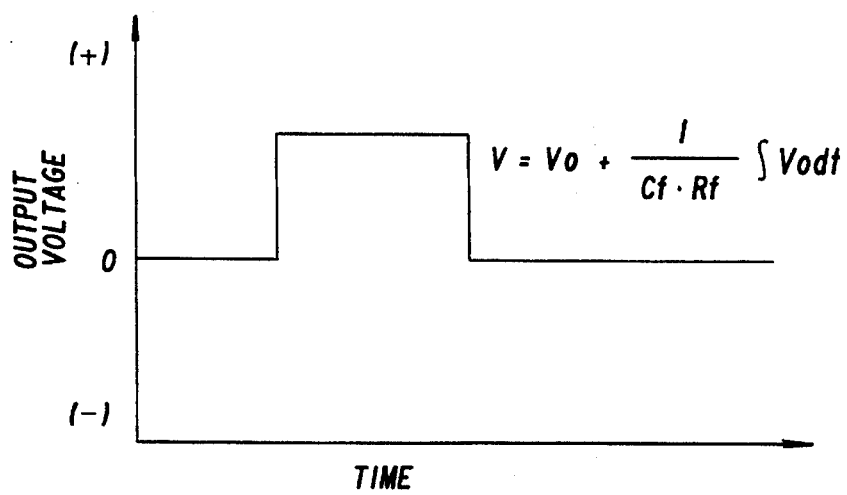

Although the voltage signal delivered from the charge amplifier 7 attenuates as shown in FIG. 11, (a), a correction signal corresponding to the amount of attenuation and shown in FIG. 11, (b) is available by integrally computing the second term of the right member of Equation (12) for the voltage signal. The correction signal, when added to the original voltage signal Vo, gives the compensated voltage signal V free of attenuation as shown in FIG. 11, (c).

Figure 12:
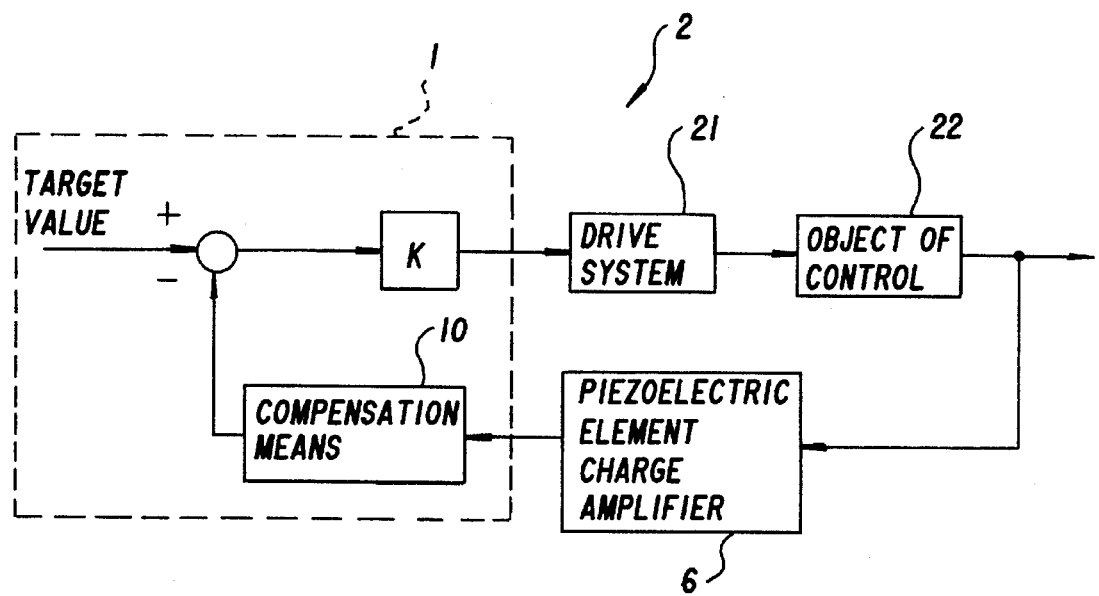
FIG. 12 is a control block diagram showing a pressure control system.

A motor 51 is controlled based on the detection signal of the pressure sensor 6 in the manner to be described below. FIG. 12 is a block diagram showing a system used at this time for controlling the pressure. For the control of pressure, a microcomputer 1 has stored therein a predetermined pressure value serving as a target value for controlling the motor 51 by feedback so as to control the force to be exerted on the electronic component to the specified value.

The deviation of the voltage signal compensated for by the compensation means 10 from the target value set in the microcomputer 1 is fed to a drive system 21 including the motor 51. The pressure obtained from an object 22 of control including the electronic component and printed board is detected by the pressure sensor 6 and fed back to the microcomputer 1.

The control thus effected permits the component 3 to be mounted on the printed board 31 with the predetermined pressure.

When the component has been completely mounted on the surface of the board, the next electronic component is attracted and mounted by repeating the same procedure as above.

Third Embodiment

Figure 14:
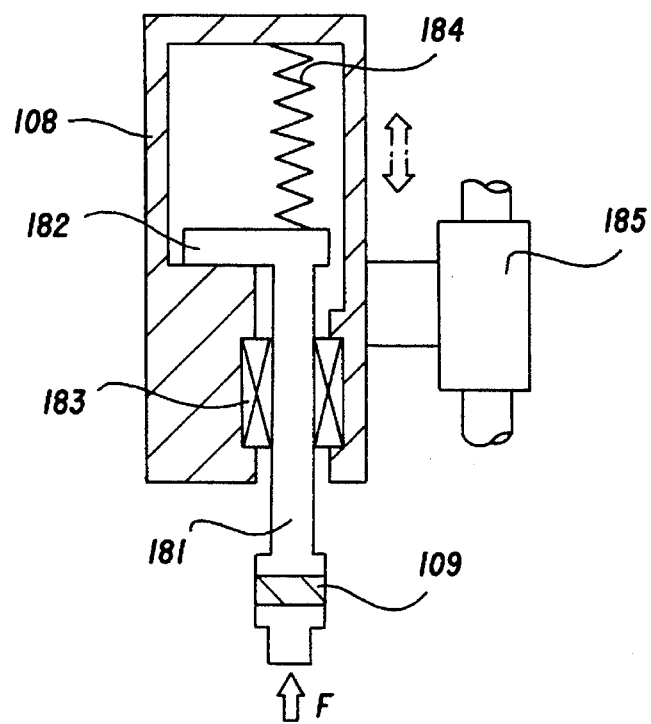
FIG. 14 is a front view partly broken away of a shock absorber we have devised previously.

We have already proposed a shock absorber shown in FIG. 14 and incorporated into a suction head mechanism for controlling the pressure to be exerted on an electronic component accurately to a predetermined value when the component is mounted on a board.

The shock absorber shown in FIG. 14 comprises a main body 108 corresponding to the outer tube 44, and a movable member 181 corresponding to the suction nozzle 41. The movable member 181 is vertically movably supported by a bearing 183 provided between the main body 108 and the movable member 181.

The movable member 181 has a head integrally formed with a projection 182. The projection 182 bears on an end portion of the main body 108 with the movable member 181 positioned as projected from the body 108 to the greatest extent under the action of a spring member 184 as illustrated to determine the position of the movable member 181 so projected.

The main body 108 has connected thereto a reciprocating device 185 corresponding to the head lift mechanism 5.

The movable member 181 is provided at its outer end with a force sensor 109 comprising a piezoelectric element or the like for directly detecting an external force F which is to be exerted on the movable member 181.

Accordingly, in the case where the shock absorber is provided as the suction head mechanism 4 of FIG. 5, the motor 51 of the head lift mechanism 5 is controllable based on the detection signal of the force sensor 109 to limit the pressure to be exerted on the electronic component 3 to not greater than a specified value when the component is mounted on the printed board.

However, with the arrangement wherein the force sensor 109 is provided at the outer end of the movable member 181 as seen in FIG. 14, the outer end portion of the movable mbmer 181 becomes inevitably large. For this reason, it is likely that this arrangement will not be usable, for example, for the suction head mechanism 4 of the automatic component mounting apparatus 2 in view of the function and durability of the movable member 181 as the suction nozzle 41.

Figure 15:
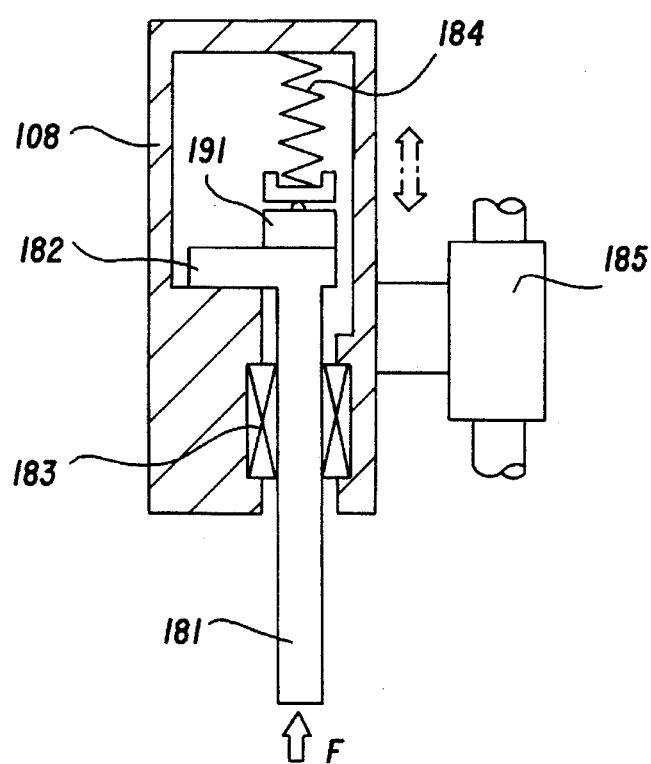
FIG. 15 is a front view partly broken away of another shock absorber devised by us.
Figure 16:
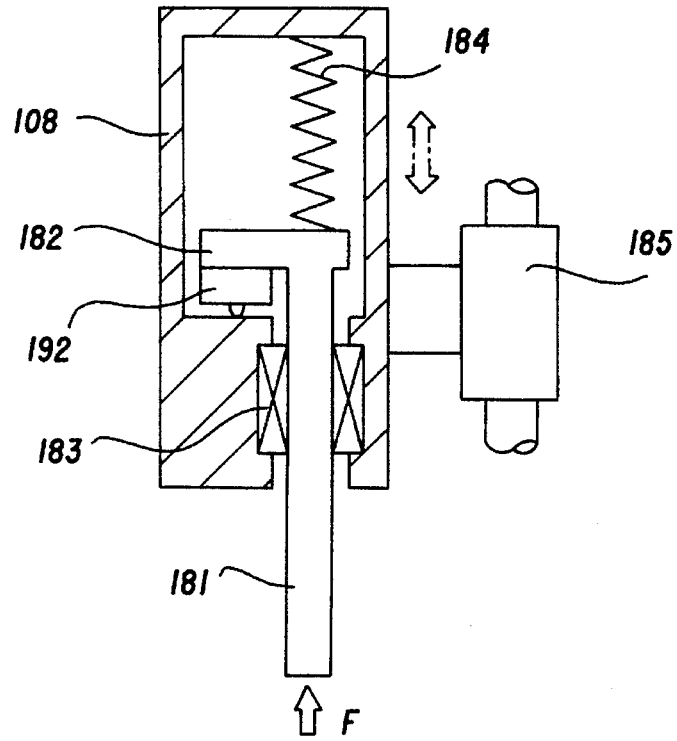
FIG. 16 is a front view partly broken away of another shock absorber devised by us.

It appears useful to dispose a force sensor 191 between the upper end of the movable member 181 and the spring member 184 as shown in FIG. 15, or to provide a force sensor 192 between the projection 182 of the movable member 181 and the main body 108 as seen in FIG. 16.

Nevertheless, with the arrangement shown in FIG. 15, the initial load $f_0$ of the spring member 184 acts on the force sensor 192 when the movable member 181 is in the most projected position, so that the spring member 84 remains undeformed if subjected to an external force not greater than the initial load $f_0$. Thus, such a small force can not be measured.

In the case where the force sensor 191 shown in FIG. 15 is provided between the upper end of the spring member 184 and the main body 108, the arrangement is unable to measure external forces not greater than the initial load $f_0$, and additionally, encounters difficulty in accurately measuring dynamic forces since the force acts on the force sensor through the spring member 184.

With the arrangement shown in FIG. 16, it is impossible to measure external forces not smaller than the initial load $f_0$ unlike the arrangement of FIG. 15.

Figure 13:
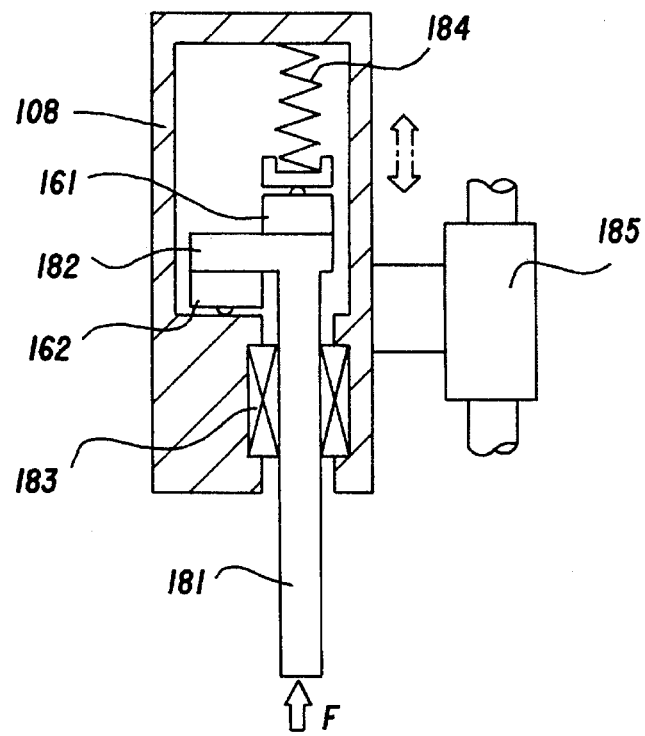
FIG. 13 is a front view partly broken away and showing the basic construction of a shock absorber in a third embodiment.

Accordingly, the present invention provides a shock absorber as shown in FIG. 13. As illustrated, a movable member 181 is disposed inside a main body 108 to which a reciprocating device 185 is connected. The movable member 181 is upwardly and downwardly movably supported by a bearing 183 provided between the body 108 and the movable member 181, The movable member 181 has a projection 182 integral with its head. A first sensor 161 is disposed on the upper surface of the projection 182 and positioned between the projection and a spring member 184. A second sensor 162 is provided on the rear side of the projection 182 opposed to the main body 108.

The first sensor 161 is subjected directly to the repulsive force of the spring member 184 to detect this force. On the other hand, the second sensor 162 serves to detect a contact pressure acting between the main body 108 and the movable member 181 as projected from the body 108 to the greatest extent.

In the case where only static forces acting on the movable member 181 other than the dynamic forces acting thereon are to be measured, the first sensor 161 can be disposed alternatively between the upper end of the spring member 184 and the main body 108.

The outputs of the first and second sensors 161, 162 are fed to a measuring circuit to compute the external force acting on the movable member 181.

Suppose the external force acting on the movable member 181 is F as shown in FIG. 13, the force acting on the first sensor 161 is $f_A$, the force acting on the second sensor 162 is $f_B$, and the initial load of the spring member 184 is $f_0$. The forces $f_A$ and $f_B$ can be expressed as divided into the following three cases according to the magnitude of the external force F.

When F=0, $f_A = f_B = f_0$. (1)

When $0 < F < f_0$, $f_A = f_0$ and $f_B = f_0 - F$. (2)

When $F \geq f_0$, $f_A = F$ and $f_B = 0$. (3)

Accordingly, the external force F ($\geq 0$) can be calculated from Equation (13) regardless of whether it is grater or smaller than $f_0$.

$$F = f_A - f_B \quad (13)$$

Thus, the external force F acting on the movable member 181 can be accurately measured based on the output of the first sensor 161 and the output of the second sensor 162 irrespective of the magnitude of the force.

A detailed description will be given of the shock absorber as adapted for use in the electronic component mounting apparatus 2 shown in FIGS. 4 and 5.

Figure 17:
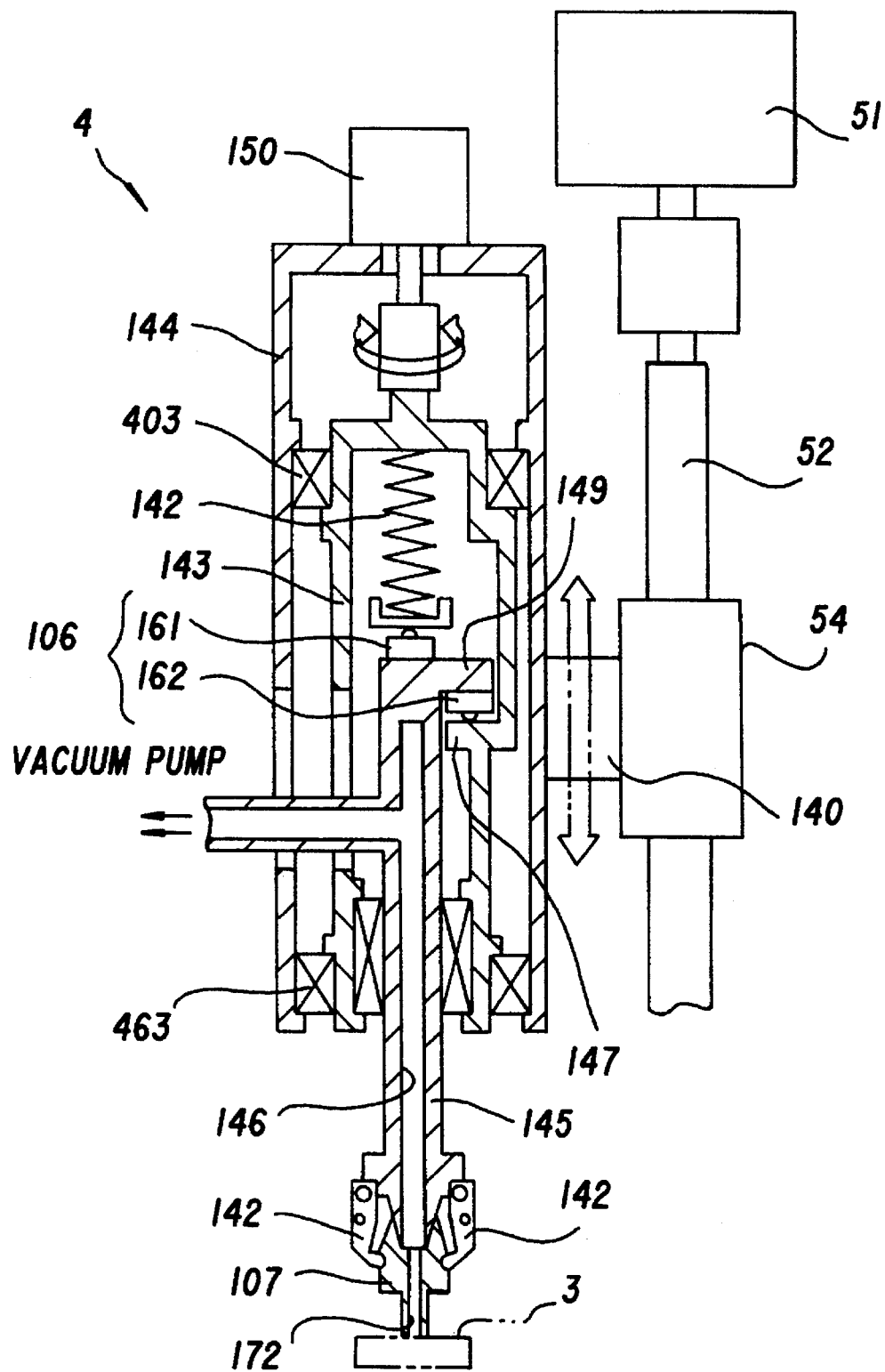
FIG. 17 is a front view partly broken away and showing an example of suction head mechanism incorporating a shock absorber.
Figure 18:
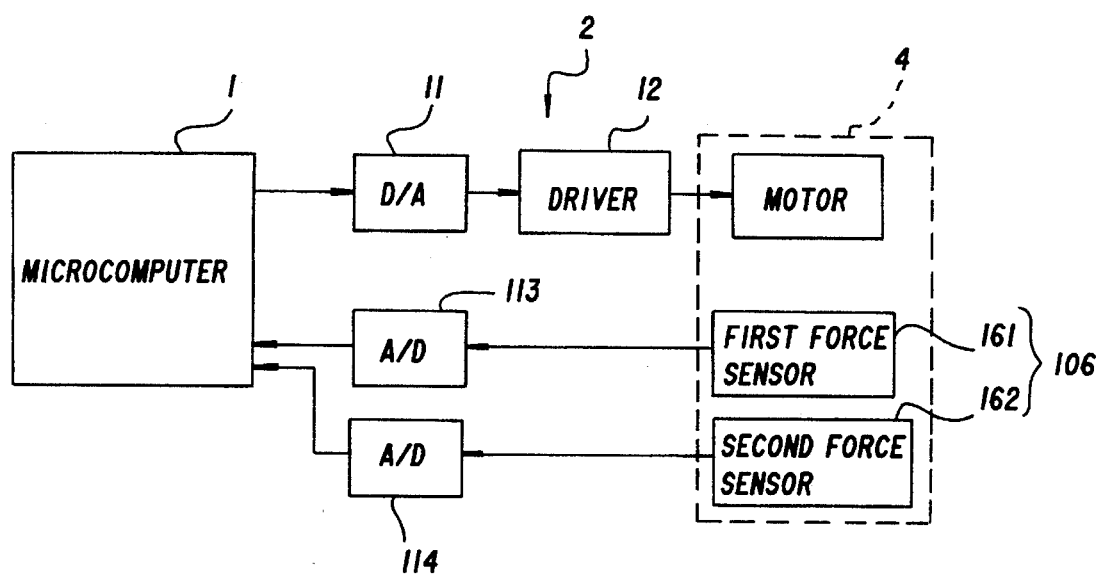
FIG. 18 is a block diagram showing a motor drive system of an automatic electronic component mounting apparatus.

FIG. 17 shows a suction head mechanism 4 which comprises an outer tube 144 vertically supported by a support arm 140, and an intermediate tube 143 provided inside the outer tube 144, supported by the tube as at 403 and rotatable about a vertical axis. Mounted on the upper end of the outer tube 144 is a servomotor 150 for adjusting the orientation of an electronic component 3 as held by the mechanism. The shaft of the motor is connected to the intermediate tube 143.

An inner tube 145 having a central bore 146 is provided inside the intermediate tube 143 in engagement therewith, is vertically movable within a given range relative to the tube 143 and is nonrotatable relative thereto. The lower limit position of the inner tube 145 is determined by a stopper 147 projecting from the intermediate tube 143. A compression spring 142 is provided between the intermediate tube 143 and the inner tube 145 for biasing the inner tube 145 downward.

The center bore 146 of the inner tube 145 is in communication with an unillustrated vacuum pump. A suction nozzle piece 107 for holding the component 3 by suction is removably attached to the lower end of the inner tube 145 and has a nozzle orifice 172 communicating with the center bore 146 of the inner tube 145.

A first sensor 161 is disposed between the upper end of the inner tube 145 and the lower end of the spring 142, and a second sensor 162 is disposed between the rear side of a projection 149 of the inner tube 145 and the stopper 147 of the intermediate tube 143. The pair of sensors provides a force sensor 106. Each of the first sensor 161 and the second sensor 162 comprises a piezoelectric element, pressure-sensitive electrically conductive rubber or the like and has a compact structure.

Thus, the intermediate tube 143 serves as a main body 108, the inner tube 145 as a movable member 181 and the spring 142 as a spring member 184 to constitute the shock absorber of FIG. 13.

The automatic mounting apparatus described has its operation controlled by a microcomputer 1 shown in FIG. 1. The outputs of the first and second sensors 161, 162 are fed to the microcomputer 1 via A/D converters 113, 114, respectively.

The microcomputer 1 has stored therein a motor control program including the foregoing calculation equation. A motor control signal is prepared based on the outputs of the first and second sensors 161, 162 and fed to a motor driver 12 via a D/A converter 11.

For the control of pressure by the computer 1, a pressure having a waveform in the form of a step, ramp or first order lag and set in the computer 1 in advance serves as a target value to control the motor 51 by feedback as shown in FIG. 9. More specifically, the deviation of a pressure measurement based on Equation (13) from the target value is fed to the drive system 21 including the motor 51. The pressure obtained from the object 22 of control including an electronic component and a printed board is detected by the force sensor 106 and fed back to the microcomputer 1.

With the mounting apparatus described, the impact force and pressure acting on the component 3 can be accurately detected regardless of the magnitude of the force or pressure based on the outputs of the force sensor 106, whereby the pressure acting on the component is controlled to a suitable value when the component is mounted. This reliably obviates damage to the component and mounting errors.

Fourth Embodiment

This embodiment is characterized by a board lift mechanism 208 for accurately controlling the pressure to be exerted on electronic components.

Figure 19:
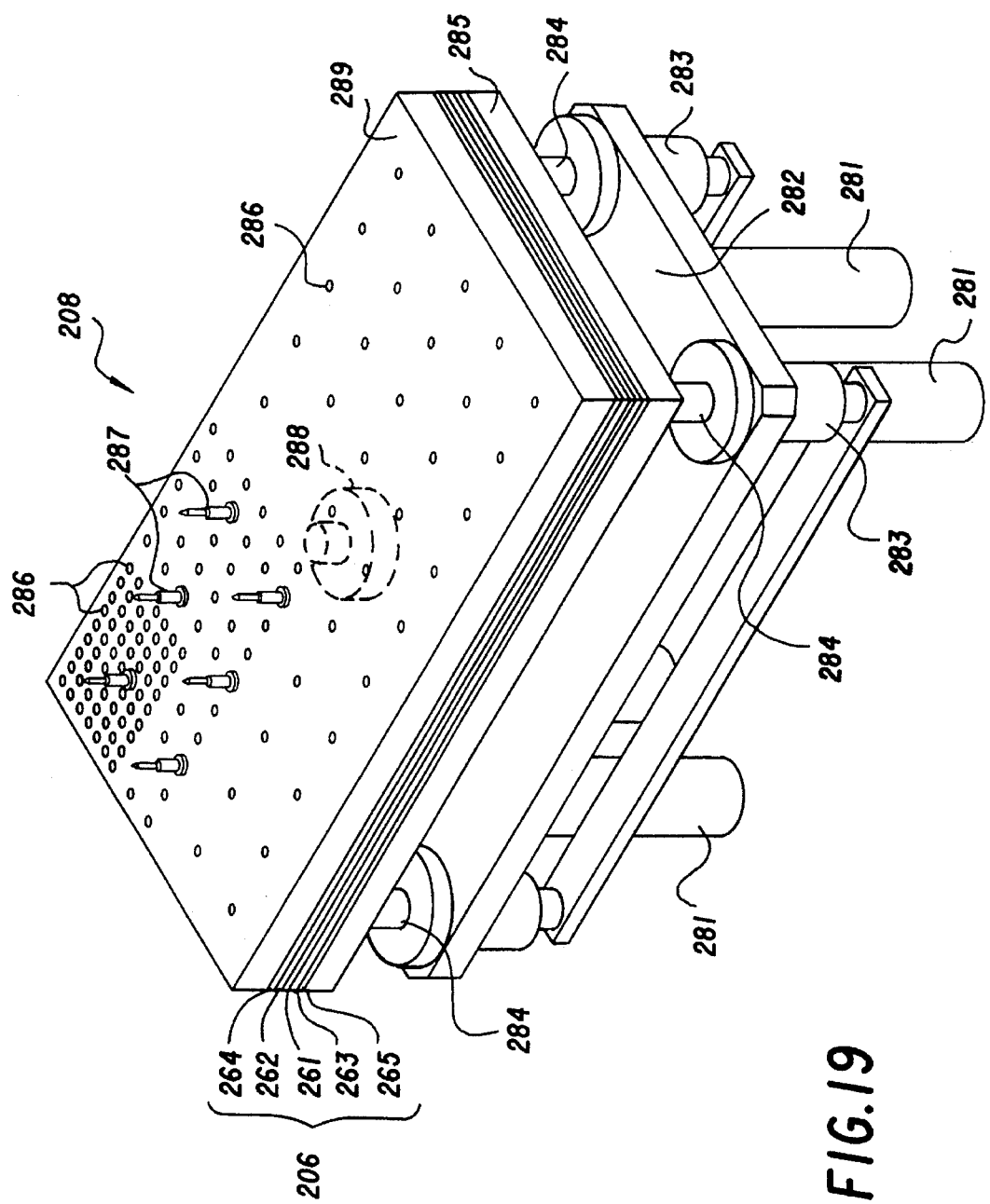
FIG. 19 is a perspective view of a board lift mechanism in a fourth embodiment.

The board lift mechanism 208 is disposed below the guide rails 32, 33 constituting the afore-mentioned board transport mechanism 7, and comprises, as shown in FIG. 19, a base 282 fixed at a predetermined level by four posts 281, four shafts 284 respectively guided for upward and downward movement by guide members 283 provided at four corners of the base 282, and a lift plate 285 fixed to the upper ends of these shaft 284. An air cylinder 288 is provided on the base 282, which has a rod with an outer end fixedly connected to the rear side of the lift plate 285.

A pin implanted plate (pin plate) 289 is disposed above the lift plate 285, with the force sensor 206 to be described later interposed therebetween. The pin plate 289 has a multiplicity of bores 286 arranged at a specified pitch. A plurality of board support pins 287 are removably fitted in the bores 286.

Accordingly, the lift plate 285 is moved upward or downward by the air cylinder 288 while the four shafts 284 are being guided by the guide members 283. With this movement, the board support pins 287 move upward or downward.

Figure 20:
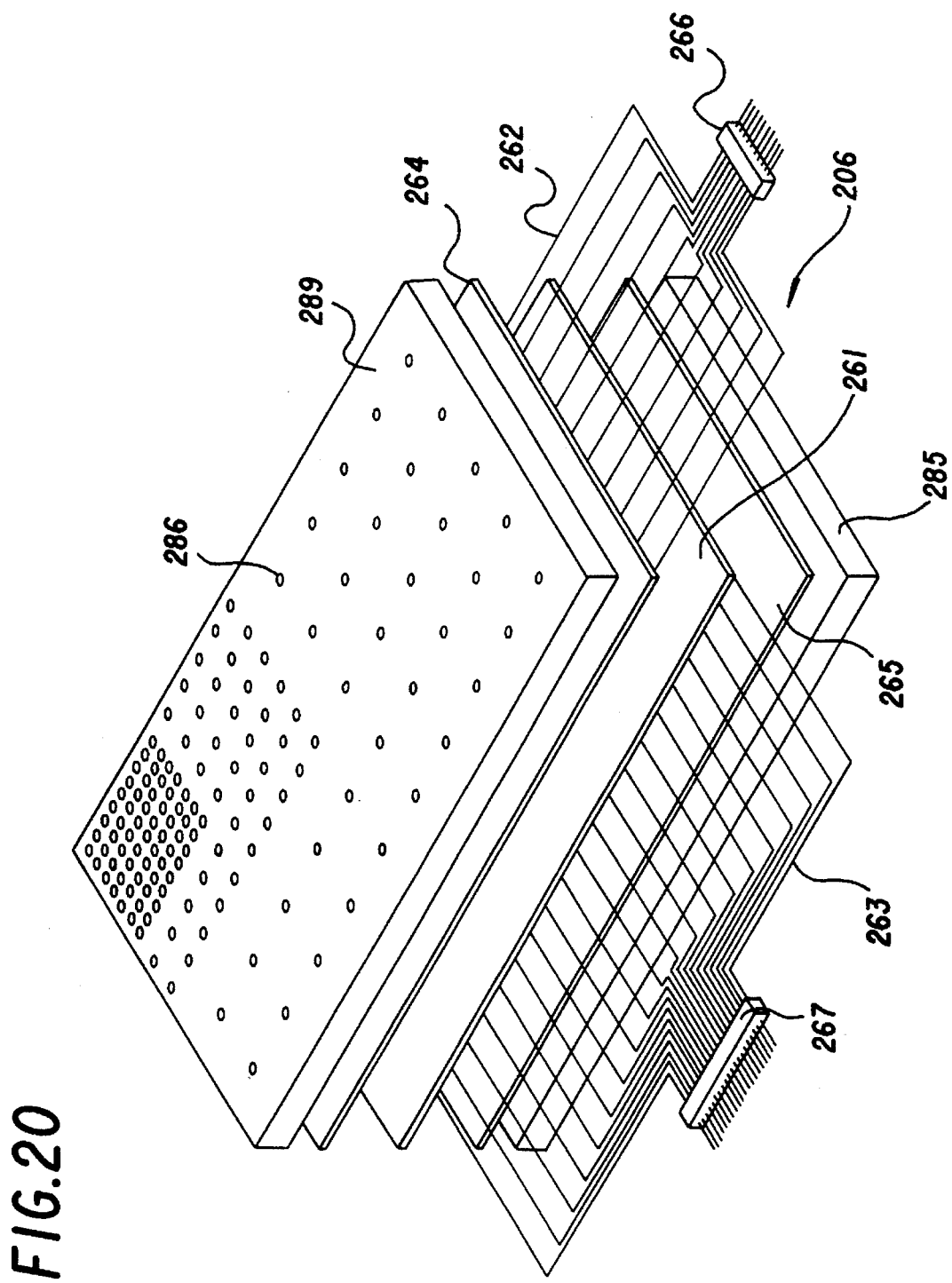
FIG. 20 is an exploded perspective view showing the construction of a force sensor.

The force sensor 206 comprises, as shown in FIG. 20, a pressure sensitive electrically conductive rubber sheet 261, a first electrode film 262 comprising a multiplicity of electrode strips extending in one direction, and a second electrode film 263 comprising a multiplicity of electrode strips extending in a direction orthogonal to the electrode strips. The films are affixed to the respective surfaces of the rubber sheet. Insulating films 264, 265 are arranged over the outer surfaces of the respective films 262, 263. Thus, the first and second electrode films 262 and 263 in a pair constitute an XY matrix.

Connectors 266, 267 are attached to the respective electrode films 262, 263, with the base ends of the electrode strips of each film electrically connected to the film. Although each of the films 262, 263 comprises the multiplicity of electrode strips as stated above and is comblike, FIG. 19 previously referred to and FIG. 24 to be referred to later show the film in the form of a rectangular sheet, while each electrode strip is shown as a line in FIG. 20 already referred to to ensure simplicity.

Figure 21:
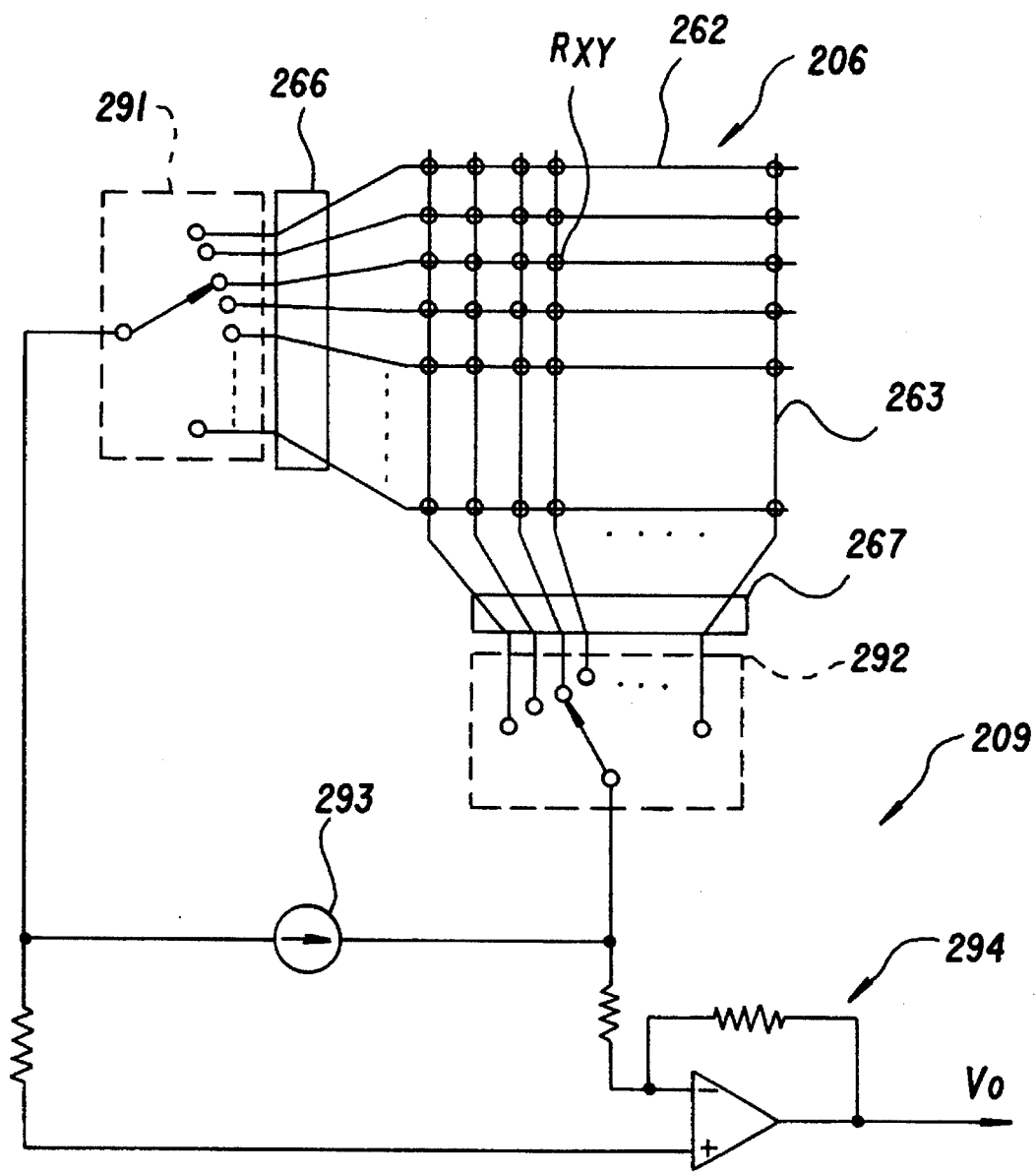
FIG. 21 is a circuit diagram showing the construction of a measuring circuit.

FIG. 21 shows a measuring circuit 209 connected to the force sensor 206. Selection circuits 291, 292 are connected to the electrodes films 262, 263 via the connectors 266, 267, respectively. These selection circuits are controlled by change-over using the microcomputer to be described later, whereby the XY matrix provided by the electrode films 262, 263 are scanned from line to line. One point of intersection of the XY matrix is selected at an optional time point.

Current is passed from a constant current source 293 through the rubber sheet 261 in the direction of its thickness at the selected intersection point, i.e., through a resistor $R_{xy}$. The resulting potential difference between the opposite ends of the resistor is amplified by a differential amplifier 294 and output as a voltage singal Vo.

When an optional portion of the rubber sheet 261 is pressed on to vary the sheet thickness, the resistance value of the portion of altered thickness varies to appear as a variation in the voltage signal Vo. Accordingly, by detecting such variations in the voltage signal Vo, a distribution of pressures acting on the rubber sheet 261 can be measured.

Figure 22:
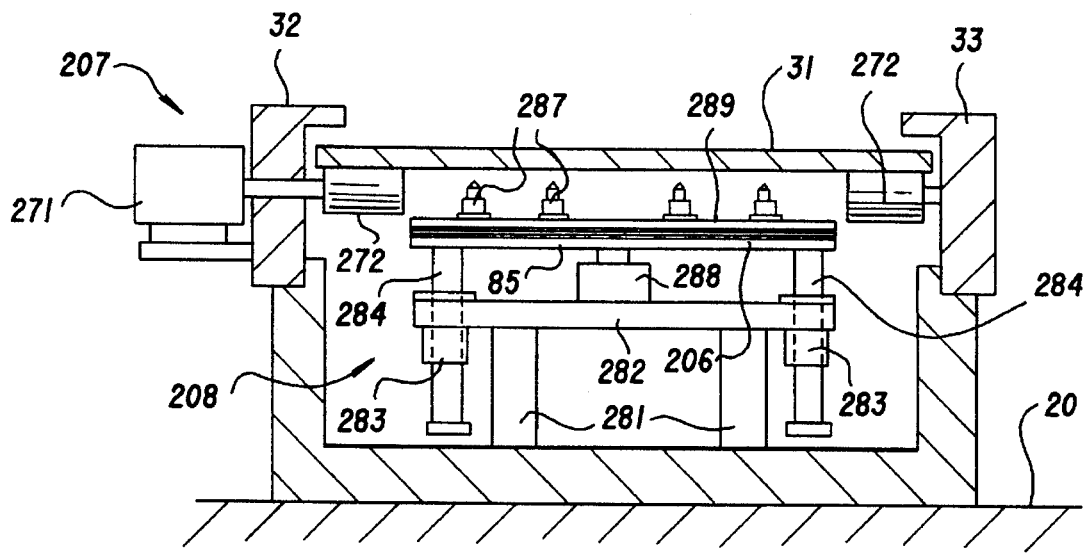
FIG. 22 is a front view partly broken away and showing the board lift mechanism and a printed board being transported thereby.
Figure 23:
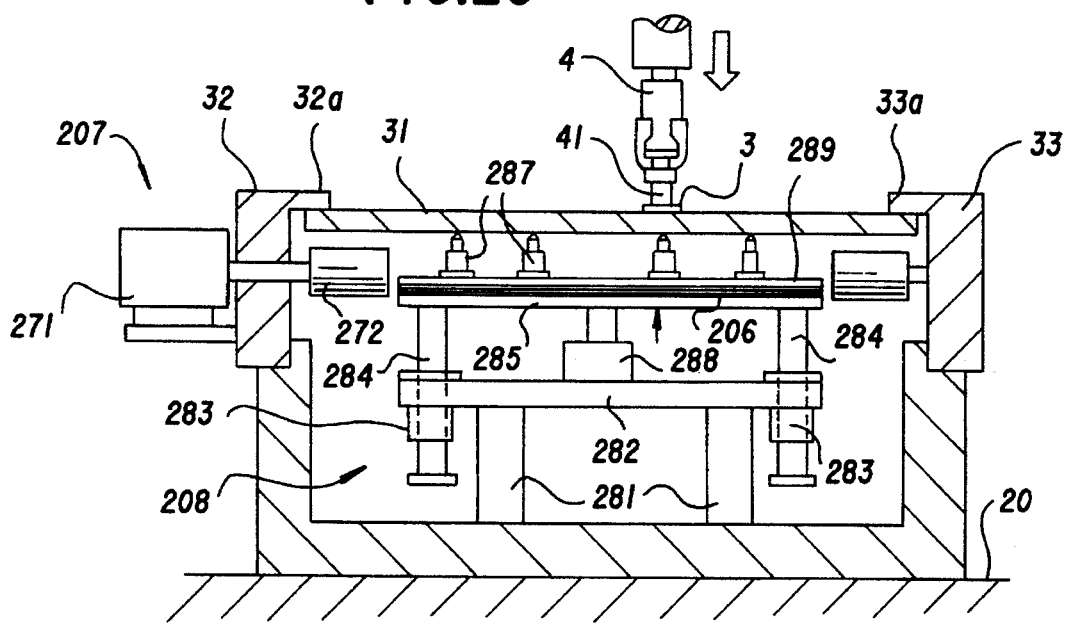
FIG. 23 is a front view partly broken away and showing the lift mechanism with the board set in position for mounting electronic components thereon.

FIGS. 22 and 23 show the mounting operation of the automatic electronic component mounting apparatus 2. A base transport mechanism 207 has many rollers 272 arranged along the pair of guide rails 32, 33. These rollers 272 are driven by a motor 271 to transport a printed board 31 horizontally.

With the board lift mechanism 208, the board support pins 287 are moved upward or downward by the operation of the air cylinder 288 as previously stated. While the board 31 is being transported horizontally as seen in FIG. 22, the lift plate 285 and the pins 287 are waiting at a lower limit position. The number and position of the board support pins 287 are suitably determined in accordance with the shape of the printed board 31 and the component mounting position.

When the board 31 is transported to a standby position immediately below the mounting position and placed in position by a known positioning mechanism, the air cylinder 288 of the lift mechanism 208 operates to raise the lift plate 285 and the pins 287. As a result, the printed board 31 is lifted by the support pins 287 and set in the specified mounting position with opposite ends of the board in contact with stoppers 32a, 33a of the guide rails 32, 33.

Next, the suction head mechanism 4 is lowered by the operation of the head lift mechansim and mounts the component 3 held to the suction nozzle 41 onto the printed board 31 at a specified position. The head lift mechanism drives the head mechanism 4 downward even after the component 3 has come into contact with the board 31 to thereby bond the component to the board 31 under pressure.

At this time, the pressure acting on the component 3 acts as a load on the board 31. This load is born by the support pins 287 supporting the board 31.

Since the support pins 287 are vertically movably fitted in the pin plate 289, the force acting on the pins 287 acts as it is on the rubber sheet 261 of the force sensor 206.

Figure 24:
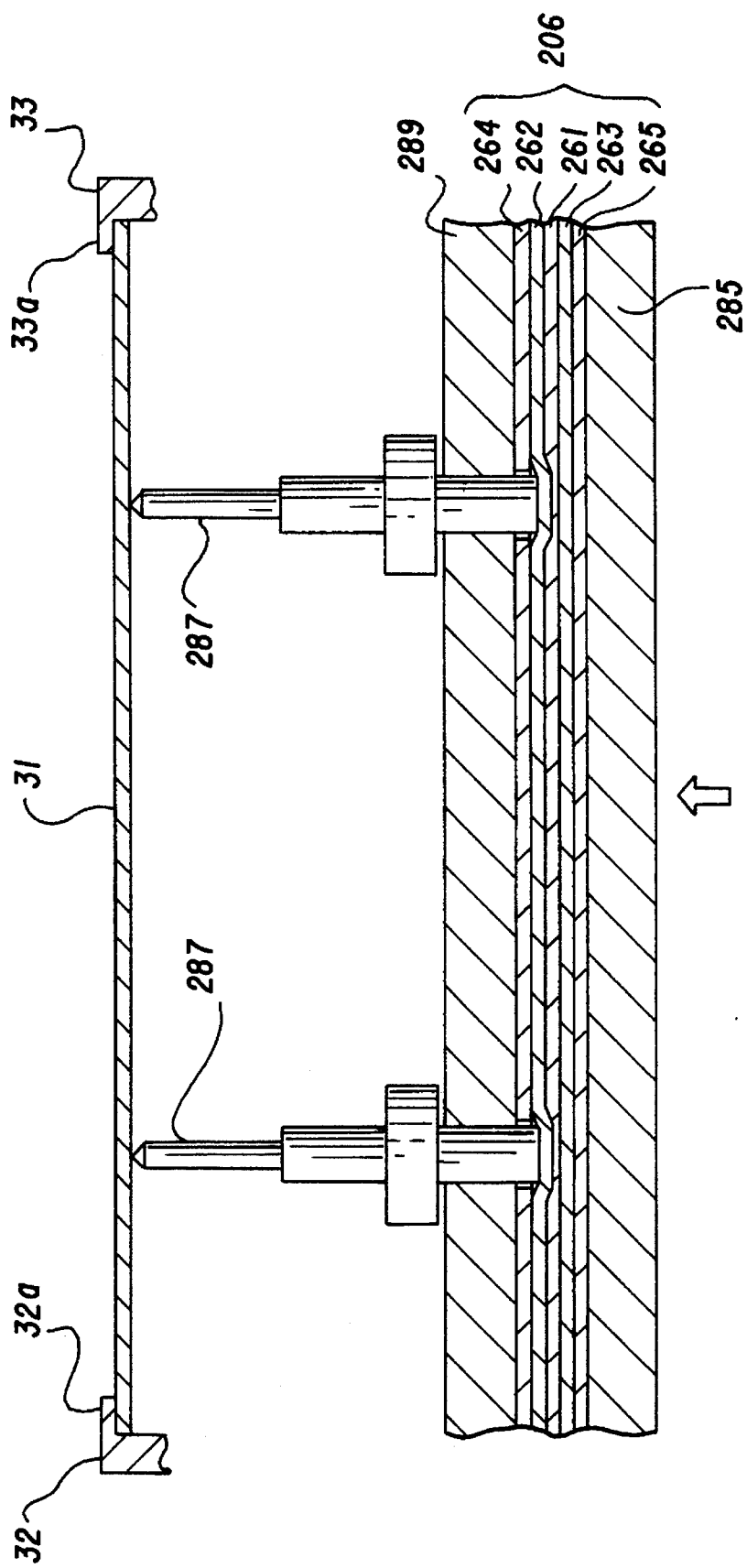
FIG. 24 is an enlarged sectional view of the force sensor with a pressure acting thereon.

FIG. 24 shows the rubber sheet 261 as pressed on by the base ends of pins 287 and altered in thickness.

Figure 25:
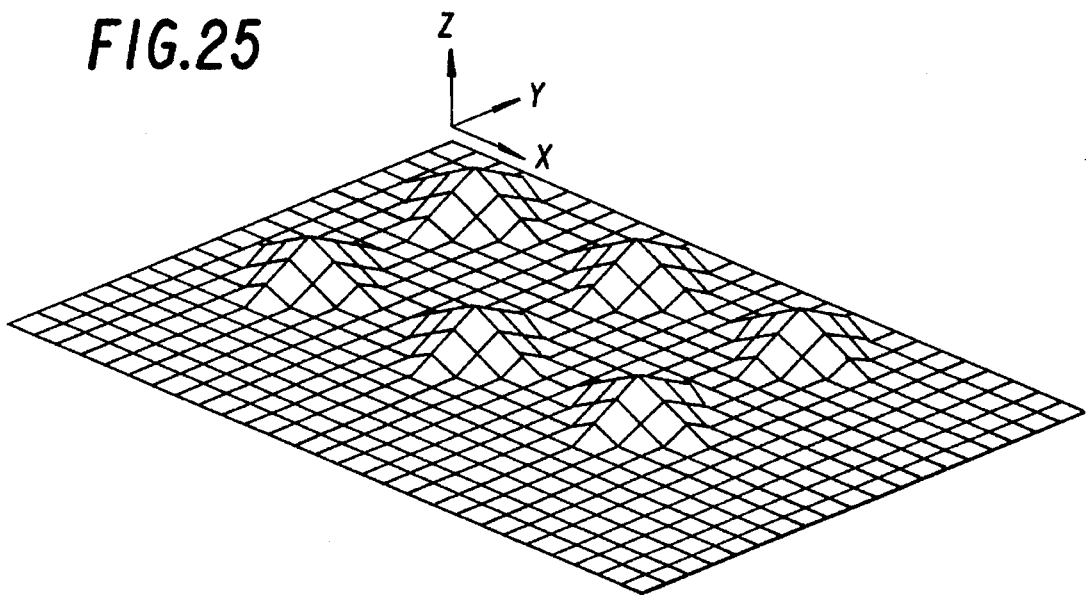
FIG. 25 is a graph showing a resistance value distribution of a pressure-sensitive electrically conductive rubber sheet subjected to an initial pressure.
Figure 26:
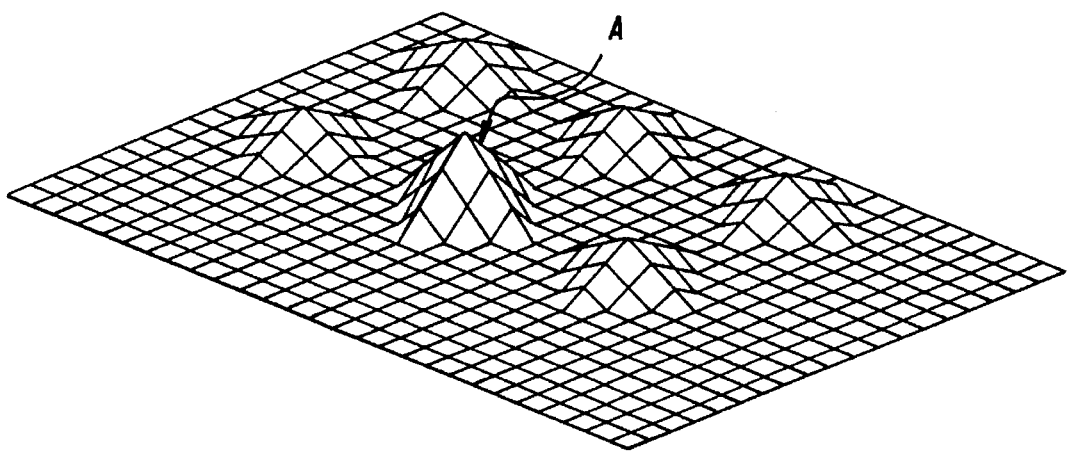
FIG. 26 is a graph showing a resistance value distribution over the rubber sheet when an electronic component is mounted on the board.

As previously described, the rubber sheet 261 has such a property that the resistance value thereof is varied by the load acting thereon. For example, when the printed board 31 is supported by six support pins 287, a distribution of resistance values occurs as shown in FIG. 25 or 26. The resistance value distribution shown in FIG. 25 is produced when the printed board 31 is raised by the lift mechanism 208 and pressed against the stoppers 32a, 33a of the guide rails 32, 33 with a given force. The distribution shown in FIG. 26 is produced when the component 3 is subsequently bonded under pressure to the board 31 by the operation of the head lift mechanism.

FIG. 25 shows low projections of approximately same height produced at locations corresponding to the six support pins. FIG. 26 shows a higher projection produced at a location A corresponding to the mounting position of the component 3.

Accordingly, the pressure distribution of FIG. 25 is subtracted from that of FIG. 26, and the result is integrated for the entire area of the rubber sheet, whereby the total value of pressure acting on the rubber sheet, i.e., the pressure acting on the component 3 is detected.

FIG. 27 shows a system for driving the suction head mechanism lifting motor 51 of the apparatus 2. To control the motor 51, the output of the force sensor 206 provided on the lift mechanism 208 is fed to a measuring circuit 209, which produces a voltage signal Vo. The signal is fed to a microcomputer 1 via an A/D converter 213.

The microcomputer 1 controls the measuring circuit 209 by change-over, and adds n x m signals (each of n and m is the number of electrodes) successively obtained from the XY matrix of the rubber sheet 261 to calculate the pressure acting on the printed board.

Furthermore, the microcomputer 1 prepares a motor control signal based on the calculated pressure (hereinafter referred to as the "pressure detection signal"). The signal is sent to a motor driver 12 via a D/A converter 1 to control the rotation of the motor 51.

The pressure is controlled by the microcomputer 1 by feedback control as in FIG. 9. FIG. 28 shows an example of pressure detection singal by feed back control. The component 3 comes into contact with the printed board 31 at point A in the drawing, with the result that the pressure detection signal rises to point B slightly higher than the level of a target value L.

At this time, the output of the force sensor is taken into the microcomputer with a sampling period which is much shorter than the rise time $t_0$ of the pressure detection signal to execute the feedback control, whereby the pressure on the component 3 can suppressed to not higher than the allowable value.

The automatic electronic component mounting apparatus described accurately measures the pressure acting on the component, and the control of pressure based on the measurement reliably precludes damage to the component due to the action of an excessive pressure.

The foregoing description of the embodiments is intended to illustrate the present invention and should not be construed as limiting the present invention as defined in the appended claims or as reducing the scope thereof. The components of the system and apparatus of the invention are not limited to those of the embodiments in construction but can of course be modified variously by one skilled in the art without departing from the spirit of the invention as set forth in the claims.

In the first embodiment, for example, the function of the comparator 81 shown in FIG. 81 can be realized by software.

In the second embodiment, the signal of the pressure sensor 6 is subjected to A/D conversion, then fed to the microcomputer and processed by software for compensation. However, the analog voltage signal before A/D conversion can be fed to hardware comprising integrator or the like, subjected to analog processing for compensation and then to A/D conversion, and thereafter fed to the microcomputer. With the second embodiment, a charge amplifier is used as the detection circuit for producing a voltage signal Vo corresponding to the charge produced by a piezoelectric element, this is not limitative. An OP amplifier of the FET type, or more conveniently, FET only, may be used to provide a circuit for effecting impedance conversion or amplification.

What is claimed is:

1. An external force measuring system comprising a piezoelectric element for producing a charge when acted on by an external force, a charge amplifier chargeable with a variation in the charge produced by the piezoelectric element to output a voltage signal, means to detect external force acting on the piezoelectric element by monitoring the output voltage signal from the charge amplifier, said charge amplifier including a feedback loop having an on-off controllable switch connected in parallel therewith, and a control means for controlling said switch, the switch being on-off controllable so as to be closed while no external force acts on the element, said control means comprising means for detecting a time point at which the output voltage of the charge amplifier has dropped below a predetermined reference value and for closing switch at said time point.

2. A component mounting apparatus for pressing a component held by a component suction head against a mount surface at a specified position thereon for installation, the apparatus being equipped with an external force measuring system for measuring a pressure acting on the component, the external force measuring system comprising a piezoelectric element mounted on the component suction head for producing a charge in accordance with the pressure, a charge amplifier chargeable with a variation in the charge produced by the piezoelectric element to output a voltage signal, means to detect external force acting on the piezoelectric element by monitoring the output voltage signal from the charge amplifier, said charge amplifier including a feedback loop having an on-off controllable switch connected in parallel therewith, and a control means for controlling said switch, the switch being on-off controllable so as to be closed after the completion of a mounting action and opened before the initiation of the subsequent mounting action.

3. An external force measuring system comprising a piezoelectric element for producing a charge when acted on by an external force, a charge amplifier chargeable with a variation in the charge produced by the piezoelectric element to output a voltage signal, means to detect external force acting on the piezoelectric element by monitoring the output voltage signal from the charge amplifier, said charge amplifier including a feedback loop having an on-off controllable switch connected in parallel therewith, and a control means for controlling said switch, the switch being on-off controllable so as to be closed while no external force acts on the element, said control means comprising means for detecting a time point for closing the switch at which the external force approaches close to the piezoelectric element.

* * * * *